United States Patent
Lee et al.

(10) Patent No.: US 10,043,451 B2
(45) Date of Patent: Aug. 7, 2018

(54) ORGANIC LIGHT-EMITTING DIODE DISPLAY

(71) Applicant: Samsung Display Co., Ltd., Yongin-si, Gyeonggi-do (KR)

(72) Inventors: Seong Min Lee, Asan-si (KR); Hyo Min Kim, Cheonan-si (KR); Ye Ji Lee, Seoul (KR); Hyuk Sang Jun, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 131 days.

(21) Appl. No.: 15/141,600

(22) Filed: Apr. 28, 2016

(65) Prior Publication Data
US 2016/0321996 A1    Nov. 3, 2016

(30) Foreign Application Priority Data
Apr. 29, 2015   (KR) .................. 10-2015-0060660

(51) Int. Cl.
*G09G 5/00*       (2006.01)
*G09G 3/3258*    (2016.01)
(Continued)

(52) U.S. Cl.
CPC ......... *G09G 3/3258* (2013.01); *G09G 3/3233* (2013.01); *G09G 3/3291* (2013.01);
(Continued)

(58) Field of Classification Search
USPC ............... 345/92, 174, 206, 204, 205, 214; 428/201; 156/250; 257/71; 313/500
See application file for complete search history.

(56) References Cited

U.S. PATENT DOCUMENTS

2005/0236970 A1* 10/2005 Matsudate .......... H01L 27/3244
313/500
2011/0215335 A1*  9/2011 Kwon .................... H01L 33/18
257/71
(Continued)

FOREIGN PATENT DOCUMENTS

JP      2011-209613 A    10/2011
KR     10-0729100 B1     6/2007
(Continued)

*Primary Examiner* — Thuy Pardo
(74) *Attorney, Agent, or Firm* — Knobbe, Martens, Olson & Bear, LLP

(57) ABSTRACT

An organic light-emitting diode (OLED) display is disclosed. In one aspect, the display includes a substrate including a display area configured to display an image and a non-display area surrounding the display area. A plurality of OLEDs are positioned in the display area, each of the OLEDs including first and second electrodes spaced apart from each other. A plurality of pixel circuits are positioned in the display area, each of the pixel circuits including a plurality of thin film transistors (TFTs) and a node line electrically connected to at least two of the TFTs and at least partially overlapping the corresponding first electrode in the depth dimension of the OLED display so as to form a parasitic capacitor. The parasitic capacitor includes a first parasitic capacitor and a second parasitic capacitor, the first parasitic capacitor having a larger capacitance than that of the second parasitic capacitor.

18 Claims, 11 Drawing Sheets

(51) Int. Cl.
*G09G 3/3291* (2016.01)
*H01L 27/32* (2006.01)
*G09G 3/3233* (2016.01)
*G09G 3/20* (2006.01)

(52) U.S. Cl.
CPC ...... *H01L 27/3248* (2013.01); *H01L 27/3262* (2013.01); *H01L 27/3265* (2013.01); *H01L 27/3276* (2013.01); *G09G 3/2007* (2013.01); *G09G 2300/0408* (2013.01); *G09G 2300/0819* (2013.01); *G09G 2300/0842* (2013.01); *G09G 2310/0251* (2013.01); *G09G 2310/0262* (2013.01); *G09G 2320/045* (2013.01); *G09G 2380/02* (2013.01)

(56) References Cited

U.S. PATENT DOCUMENTS

| | | | | |
|---|---|---|---|---|
| 2011/0217524 | A1* | 9/2011 | Kim | B32B 37/14 |
| | | | | 428/201 |
| 2013/0050144 | A1* | 2/2013 | Reynolds | G06F 3/0416 |
| | | | | 345/174 |
| 2013/0088418 | A1* | 4/2013 | Kim | H04N 13/0434 |
| | | | | 345/92 |
| 2014/0083607 | A1* | 3/2014 | Kim | B32B 37/14 |
| | | | | 156/250 |
| 2017/0300149 | A1* | 10/2017 | Shepelev | G06F 3/044 |

FOREIGN PATENT DOCUMENTS

| | | |
|---|---|---|
| KR | 10-1334100 B1 | 11/2013 |
| KR | 10-1352322 B1 | 1/2014 |

\* cited by examiner

US 10,043,451 B2

ORGANIC LIGHT-EMITTING DIODE DISPLAY

INCORPORATION BY REFERENCE TO ANY PRIORITY APPLICATIONS

This application claims priority to and the benefit of Korean Patent Application No. 10-2015-0060660 filed in the Korean Intellectual Property Office on Apr. 29, 2015, the entire contents of which are incorporated herein by reference.

BACKGROUND

Field

The described technology generally relates to an organic light-emitting diode display.

Description of the Related Technology

Modern flat panel display technologies include organic light-emitting diode (OLED) displays, liquid crystal display (LCDs), plasma display panels, and the like. An OLED display includes a substrate as well as thin film transistors and OLEDs formed over the substrate.

SUMMARY OF CERTAIN INVENTIVE ASPECTS

One inventive aspect relates to an OLED display having advantages of suppressing generation of an unintended deviation between currents supplied to a plurality of OLEDs formed over an entire substrate.

Another aspect is an OLED display including: a substrate including a display area displaying an image; a plurality of OLEDs positioned on the display area of the substrate and each including a plurality of electrodes spaced apart from each other; and a plurality of pixel circuits positioned on the display area of the substrate and each including a plurality of thin film transistors each connected to the plurality of OLEDs and a node line connecting between any one and another of the plurality of thin film transistors and overlapping the electrode by a portion or more to form a parasitic capacitance together with the electrode, wherein the parasitic capacitance formed in a central area of the display area is larger than the parasitic capacitance formed in an exterior area of the display area.

A node line of one pixel circuit positioned on the central area of the display area among the plurality of pixel circuits may be overlapping the electrode at an area wider than an area at which a node line of the other pixel circuit positioned on the exterior area of the display area is overlapping the electrode.

The node line of one pixel circuit may have a width larger than that of the node line of the other pixel circuit.

An area of one electrode overlapping the node line of one pixel circuit among the plurality of electrodes may be wider than that of the other electrode overlapping the node line of the other pixel circuit.

A gap between a node line of one pixel circuit positioned on the central area of the display area among the plurality of pixel circuits and the electrode may be narrower than that between a node line of the other pixel circuit positioned on the exterior area of the display area and the electrode.

A dielectric constant of one insulating layer positioned between a node line of one pixel circuit positioned on the central area of the display area among the plurality of pixel circuits and the electrode may be larger than that of the other insulating layer positioned between a node line of the other pixel circuit positioned on the exterior area of the display area and the electrode.

The substrate may further include a non-display area neighboring to the display area, and the OLED display may further include: a plurality of data lines extended in one direction on the substrate and connected to the plurality of thin film transistors; and a data driver positioned on the non-display area of the substrate and connected to the plurality of data lines, wherein the exterior area neighbors to the data driver.

The plurality of thin film transistors may include: a first thin film transistor positioned on the substrate and including a first active pattern connected to the OLED and a first gate electrode positioned on the first active pattern; a second thin film transistor including a second active pattern connected to one end portion of the first active pattern to be connected to the data line and a second gate electrode positioned on the second active pattern; and a third thin film transistor including a third active pattern connected to the other end portion of the first active pattern to be connected to the first gate electrode through the node line and a third gate electrode positioned on the third active pattern.

The node line may be connected to each of the first gate electrode and the third active pattern through contact holes.

The node line may be positioned on the same layer as a layer on which the data line is positioned.

The OLED display may further include: a first scan line positioned on the second active pattern, traversing each of the second active pattern and the third active pattern, and connected to the second gate electrode and the third gate electrode; and a driving power supply line neighboring to the data line on the first scan line, traversing the first scan line, and connected to the first active pattern.

The OLED display may further include: a capacitor electrode connected to the driving power supply line, positioned on the first gate electrode, and overlapping the first gate electrode to form a capacitor together with the first gate electrode.

The plurality of thin film transistors may further include a fourth thin film transistor including a fourth active pattern connected to the third active pattern and connected to the first gate electrode through the node line and a fourth gate electrode positioned on the fourth active pattern, and the OLED display may further include: a second scan line positioned on the fourth active pattern, traversing the fourth active pattern, and connected to the fourth gate electrode; and an initialization power supply line connected to the fourth active pattern.

The plurality of thin film transistors may further include: a fifth thin film transistor including a fifth active pattern connecting between the first active pattern and the driving power supply line and a fifth gate electrode positioned on the fifth active pattern; and a sixth thin film transistor including a sixth active pattern connecting between the first active pattern and the OLED and a sixth gate electrode positioned on the sixth active pattern, and the OLED display may further include an emission control line positioned on each of the fifth active pattern and the sixth active pattern, traversing each of the fifth active pattern and the sixth active pattern, and connected to each of the fifth gate electrode and the sixth gate electrode.

The plurality of thin film transistors may further include a seventh thin film transistor including a seventh active pattern connected to the fourth active pattern and a seventh gate electrode positioned on the seventh active pattern, and the OLED display may further include a third scan line positioned on the seventh active pattern, traversing the seventh active pattern, and connected to the seventh gate electrode.

Another aspect is an organic light-emitting diode (OLED) display, comprising: a substrate including a display area configured to display an image and a non-display area surrounding the display area, wherein the display area includes a first area and an second area, and wherein the second area is closer to the non-display area than the first area; a plurality of OLEDs positioned in the display area, wherein each of the OLEDs includes first and second electrodes spaced apart from each other; and a plurality of pixel circuits positioned in the display area, wherein each of the pixel circuits includes i) a plurality of thin film transistors (TFTs) electrically connected to the OLEDs and ii) a node line electrically connected to at least two of the TFTs and at least partially overlapping the corresponding first electrode in the depth dimension of the OLED display so as to form a parasitic capacitor, wherein the parasitic capacitor includes a first parasitic capacitor formed in the first area and a second parasitic capacitor formed in the second area, wherein the first parasitic capacitor has a larger capacitance than that of the second parasitic capacitor.

In the above OLED display, the pixel circuits include a first pixel circuit located in the first area and a second pixel circuit located in the second area, wherein the node line of the first pixel circuit overlaps the corresponding first electrode in an area greater than an area at which the node line of the second pixel circuit overlaps the corresponding first electrode in the depth dimension of the OLED display.

In the above OLED display, the node line of the first pixel circuit has a width greater than that of the node line of the second pixel circuit.

In the above OLED display, an area of the first electrode overlapping the node line of the first pixel circuit is greater than that of the first electrode overlapping the node line of the second pixel circuit.

In the above OLED display, a gap between a node line of the first pixel circuit and the corresponding first electrode is narrower than that between a node line of the second pixel circuit and the corresponding first electrode.

The above OLED display further comprises an insulating layer formed in the first area and the external area, wherein the insulating layer is interposed between a node line of the first pixel circuit and the corresponding first electrode, and wherein the dielectric constant of the insulating layer in the first area is greater than that of the insulating layer in the second area.

In the above OLED display, the OLED display further comprises: a plurality of data lines extending in a first direction over the substrate and electrically connected to the TFTs; and a data driver positioned in the non-display area and electrically connected to the data lines, wherein the second area is adjacent to the data driver.

In the above OLED display, the TFTs include: a first TFT formed over the substrate and including i) a first active pattern electrically connected to the OLED and ii) a first gate electrode positioned over the first active pattern; a second TFT including i) a second active pattern electrically connected to a first end of the first active pattern to be electrically connected to the data line and ii) a second gate electrode positioned over the second active pattern; and a third thin film transistor including i) a third active pattern electrically connected to a second end of the first active pattern to be electrically connected to the first gate electrode via the node line and ii) a third gate electrode positioned over the third active pattern.

In the above OLED display, the node line is electrically connected to each of the first gate electrode and the third active pattern via one of a plurality of contact holes.

In the above OLED display, the node line and the data line are formed on the same layer.

The above OLED display further comprises: a first scan line positioned over the second active pattern and electrically connected to the second and third gate electrodes; and a driving power supply line located adjacent to the data line over the first scan line, and electrically connected to the first active pattern.

The above OLED display further comprises a capacitor electrode electrically connected to the driving power supply line, positioned over the first gate electrode, and overlapping the first gate electrode in the depth dimension of the OLED display to form a capacitor with the first gate electrode.

In the above OLED display, the TFTs further include a fourth TFT including i) a fourth active pattern electrically connected to the third active pattern and the first gate electrode via the node line and ii) a fourth gate electrode positioned over the fourth active pattern, wherein the OLED display further comprises: a second scan line positioned over the fourth active pattern and electrically connected to the fourth gate electrode; and an initialization power supply line electrically connected to the fourth active pattern.

In the above OLED display, the TFTs further include: a fifth TFT including i) a fifth active pattern electrically connected to the first active pattern and the driving power supply line and ii) a fifth gate electrode positioned over the fifth active pattern; and a sixth thin film transistor including i) a sixth active pattern electrically connected to the first active pattern and the OLED and ii) a sixth gate electrode positioned over the sixth active pattern, wherein the OLED display further comprises an emission control line positioned over each of the fifth and sixth active patterns and electrically connected to each of the fifth and sixth gate electrodes.

In the above OLED display, the TFTs further include a seventh thin film transistor including i) a seventh active pattern electrically connected to the fourth active pattern and ii) a seventh gate electrode positioned over the seventh active pattern, and wherein the OLED display further comprises a third scan line positioned over the seventh active pattern and electrically connected to the seventh gate electrode.

Another aspect is an organic light-emitting diode (OLED) display, comprising: a substrate including a display area configured to display an image and a non-display area surrounding the display area, wherein the display area includes a first area and an second area, and wherein the second area is closer to the non-display area than the first area; a plurality of OLEDs including a first OLED positioned in the first area and a second OLED positioned in the second area, wherein each OLED includes a first electrode; a plurality of pixel circuits positioned in the first and second areas and each pixel circuit including a node line formed over the substrate and overlapping the corresponding first or second OLED in the depth dimension of the OLED display so as to form a parasitic capacitor, wherein the parasitic capacitor includes a first parasitic capacitor formed in the first area and a second parasitic capacitor formed in the second area, and wherein the first parasitic capacitor is larger in size than the second parasitic capacitor.

In the above OLED display, the pixel circuits each include a plurality of thin film transistors (TFTs), wherein the OLED includes first and second electrode layers and a organic emission layer interposed therebetween, and wherein the first electrode layer overlaps at least some of the TFTs in the corresponding pixel circuit.

In the above OLED display, the distance between the first electrode layer and the node line in the first parasitic capacitor is less than the distance between the first electrode layer and the node line in the second parasitic capacitor.

In the above OLED display, the first OLED includes a first dielectric layer having a first dielectric constant, wherein the second OLED includes a second dielectric layer having a second dielectric constant, and wherein the first dielectric constant is greater than the second dielectric constant.

The above OLED display further comprises a data driver located farther from the first area than the second area and configured to provide data signals to the pixel circuits.

According to at least some of the disclosed embodiments, an unintended deviation between currents supplied to a plurality of OLEDs formed over an entire substrate in an OLED display can be suppressed.

DETAILED DESCRIPTION OF CERTAIN INVENTIVE EMBODIMENTS

Figure 1:
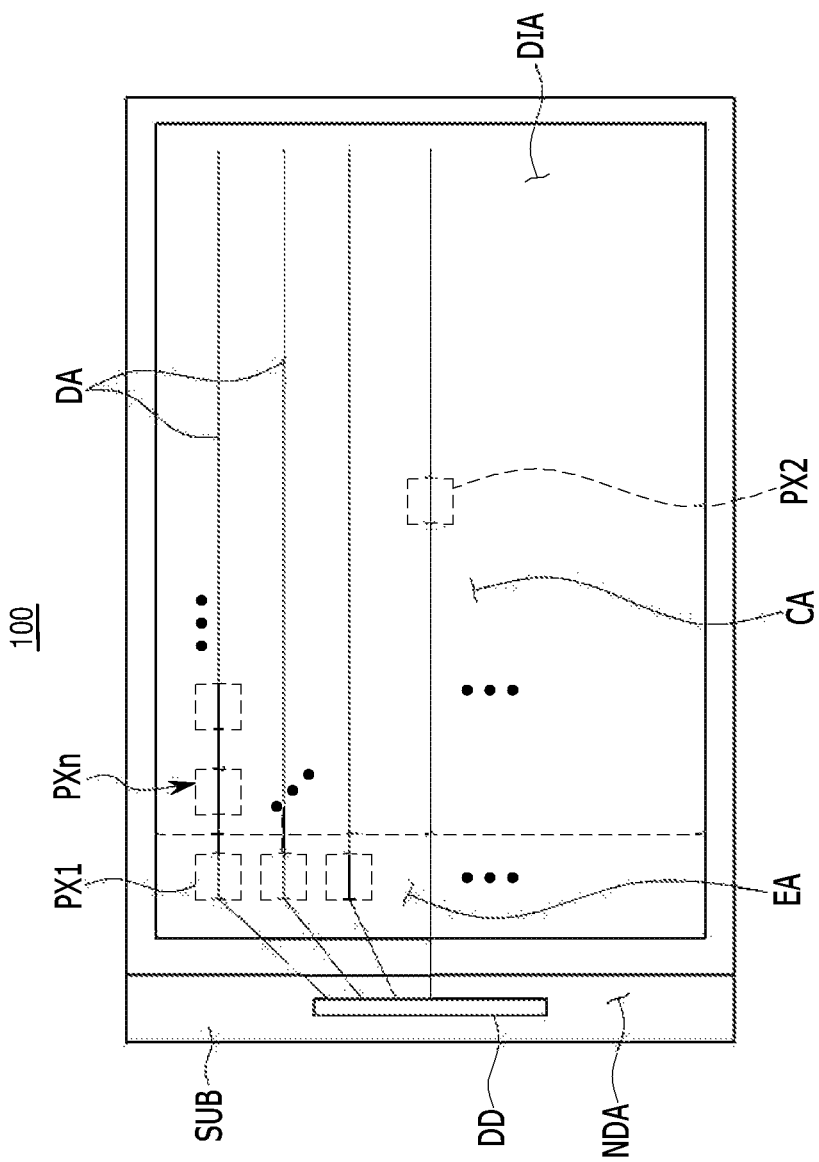
FIG. 1 is a plan view schematically showing an OLED display according to an exemplary embodiment.

Hereinafter, several exemplary embodiments of the described technology will be described in detail with reference to the accompanying drawings so that those skilled in the art to which the described technology pertains may easily practice the described technology. However, the described technology may be implemented in various different forms and is not limited to exemplary embodiments provided herein.

Portions unrelated to the description will be omitted in order to obviously describe the described technology, and similar components will be denoted by the same reference numerals throughout the present specification.

In addition, in several exemplary embodiments, components having the same configuration will be representatively described using the same reference numerals in an exemplary embodiment, and only components different from those of an exemplary embodiment will be described in the other exemplary embodiments.

In addition, since sizes and thicknesses of the respective components shown in the accompanying drawings are arbitrarily shown for convenience of explanation, the described technology is not necessarily limited to contents shown in the accompanying drawings.

In the drawings, the thickness of layers, films, panels, regions, etc., are exaggerated for clarity. In addition, in the accompanying drawings, thicknesses of some of layers and regions have been exaggerated for convenience of explanation. It will be understood that when an element such as a layer, a film, a region, or a substrate is referred to as being "on" another element, it may be directly on another element or may have an intervening element present therebetween.

In addition, throughout the present specification, unless explicitly described to the contrary, the word "comprise" and variations such as "comprises" or "comprising", will be understood to imply the inclusion of stated elements but not the exclusion of any other elements. In addition, throughout the specification, the word "on" does not necessarily mean that any element is positioned at an upper side based on a gravity direction, but means that any element is positioned above or below a target portion. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Hereinafter, an OLED display according to an exemplary embodiment will be described with reference to FIGS. 1 to 5.

FIG. 1 is a plan view schematically showing an OLED display 100 according to an exemplary embodiment. Hereinafter, a pixel may mean a minimum unit displaying an image.

As shown in FIG. 1, the OLED display 100 includes a substrate SUB, a plurality of pixels PXns, a plurality of data lines DAs, and a data driver DD.

The substrate SUB includes a display area DIA displaying an image and a non-display area NDA neighboring or surrounding the display area DIA. The non-display area NDA may be positioned to enclose an edge of the display area DIA. The substrate SUB is an insulating substrate formed of glass, polymer, stainless steel, or the like. The substrate SUB may be flexible, stretchable, foldable, bendable, or rollable. The substrate SUB is flexible, stretchable, foldable, bendable, or rollable, such that an entire OLED display may be flexible, stretchable, foldable, bendable, or rollable.

The pixels PXns are positioned on the substrate SUB so as to correspond to the display area DIA of the substrate SUB. Each of the pixels PXns is connected to each of the data lines DAs, and includes a pixel circuit including an OLED emitting light at a luminance corresponding to a driving current corresponding to a data signal supplied from each of the data lines DAs, a plurality of thin film transistors controlling the driving current flowing to the OLED, and at least one capacitor. Each of the pixels PXns includes the OLED. Therefore, a plurality of pixel circuits including a plurality of OLEDs and a plurality of thin film transistors each connected to the OLEDs are positioned on the display area DIA.

Although not shown in FIG. 1 for convenience of explanation, each of the pixels PXns may be connected to one of a plurality of scan lines connected to a gate driver supplying different scan signals, and be connected to a driving power supply line and an initialization power supply line supplying voltages. In addition, a second electrode, which is a cathode electrode, of the OLED included in each of the pixels PXns may be connected to a common power supply. A detailed structure of each of the pixels PXns will be described below. The gate driver, the scan lines, the driving power supply line, and the initialization power supply line described above will be described below. However, the gate driver, the scan lines, the driving power supply line, and the initialization power supply line described above are not limited thereto, but may be connected to each of the pixels PXns in various known forms.

Each of the pixels PXns includes a first pixel PX1 positioned on an exterior area EA of the display area DIA of the substrate SUB and a second pixel PX2 positioned on a central area (or first area) CA of the display area DIA of the substrate SUB.

Here, the exterior area EA of the display area DIA of the substrate SUB may be an area neighboring the data driver DD. However, the exterior area (or second area) EA is not limited thereto, but may be any area within the display area DIA of the substrate SUB as long as it is an area neighboring the central area CA of the display area DIA of the substrate SUB.

Each of the data lines DA extends in one direction on the substrate SUB and is connected to each of the plurality of pixels PXns.

The data driver DD is positioned on the non-display area NDA of the substrate SUB and is connected to the data lines DAs. The data driver DD supplies a data signal to each of the data lines DAs depending on a control signal supplied from the outside such as a timing controller, or the like. The data signal supplied from the data driver DD to the data line DA is supplied to one pixel PXn selected by the scan signal whenever the scan signal is supplied from the scan line to the selected one pixel PXn. In this case, one pixel PXn is charged with a voltage corresponding to the data signal and emits light having a luminance corresponding to the voltage.

Hereinafter, a circuit of one pixel PXn of the OLED display according to an exemplary embodiment will be described with reference to FIG. 2.

Figure 2:
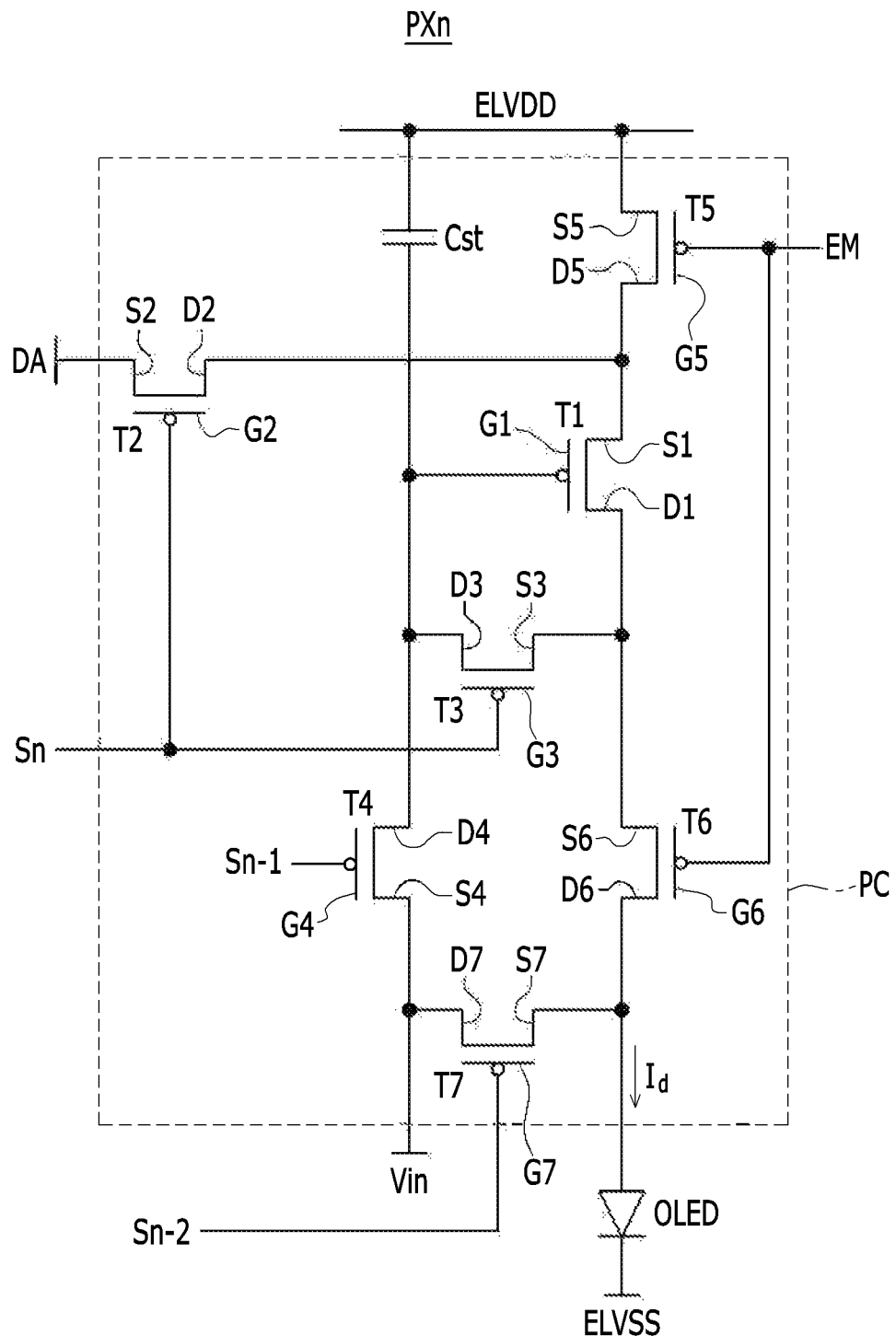
FIG. 2 is a circuit diagram showing one pixel of the OLED display according to an exemplary embodiment shown in FIG. 1.

FIG. 2 is a circuit diagram showing one pixel of the OLED display according to an exemplary embodiment shown in FIG. 1.

As shown in FIG. 2, one pixel PXn of the OLED display according to an exemplary embodiment includes a pixel circuit PC including a plurality of thin film transistors T1, T2, T3, T4, T5, T6, and T7 and a capacitor Cst, a plurality of wirings Sn, Sn-1, Sn-2, EM, Vin, DA, and ELVDD selectively connected to the thin film transistors T1, T2, T3, T4, T5, T6, and T7, and an OLED.

The thin film transistors T1, T2, T3, T4, T5, T6, and T7 include a first thin film transistor T1, a second thin film transistor T2, a third thin film transistor T3, a fourth thin film transistor T4, a fifth thin film transistor T5, a sixth thin film transistor T6, and a seventh thin film transistor T7.

A first gate electrode G1 of the first thin film transistor T1 is connected to each of a third drain electrode D3 of the third thin film transistor T3 and a fourth drain electrode D4 of the fourth thin film transistor T4, a first source electrode S1 of the first thin film transistor T1 is connected to each of a second drain electrode D2 of the second thin film transistor T2 and a fifth drain electrode D5 of the fifth thin film transistor T5, and a first drain electrode D1 of the first thin film transistor T1 is connected to each a third source electrode S3 of the third thin film transistor T3 and a sixth source electrode S6 of the sixth thin film transistor T6.

A second gate electrode G2 of the second thin film transistor T2 is connected to a first scan line Sn, and a second source electrode S2 of the second thin film transistor T2 is connected to a data line DA. The second drain electrode D2 of the second thin film transistor T2 is connected to the first source electrode S1 of the first thin film transistor T1.

A third gate electrode G3 of the third thin film transistor T3 is connected to the first scan line Sn, and the third source electrode S3 of the third thin film transistor T3 is connected to the first drain electrode D1 of the first thin film transistor T1. The third drain electrode D3 of the third thin film transistor T3 is connected to the first gate electrode G1 of the first thin film transistor T1.

A fourth gate electrode G4 of the fourth thin film transistor T4 is connected to a second scan line Sn-1, and a fourth source electrode S4 of the fourth thin film transistor T4 is connected to an initialization power supply line Vin The fourth drain electrode D4 of the fourth thin film transistor T4 is connected to the first gate electrode G1 of the first thin film transistor T1.

A fifth gate electrode G5 of the fifth thin film transistor T5 is connected to an emission control line EM, and a fifth source electrode S5 of the fifth thin film transistor T5 is connected to a driving power supply line ELVDD The fifth drain electrode D5 of the fifth thin film transistor T5 is connected to the first source electrode S1 of the first thin film transistor T1.

A sixth gate electrode G6 of the sixth thin film transistor T6 is connected to the emission control line EM, and the sixth source electrode S6 of the sixth thin film transistor T6 is connected to the first drain electrode D1 of the first thin film transistor T1.

A seventh gate electrode G7 of the seventh thin film transistor T7 is connected to a third scan line Sn-2, and a seventh source electrode S7 of the seventh thin film transistor T7 is connected to the OLED. A seventh drain electrode D7 of the seventh thin film transistor T7 is connected to the fourth source electrode S4 of the fourth thin film transistor T4.

The scan lines described above include a first scan line Sn transferring a first scan signal to each of the second gate electrode G2 and the third gate electrode G3. The scan lines also include a second scan line Sn-1 transferring a second scan signal to the fourth gate electrode G4, a third scan line Sn-2 transferring a third scan signal to the seventh gate electrode G7, and an emission control line EM transferring an emission control signal to each of the fifth gate electrode G5 and the sixth gate electrode G6.

The capacitor Cst includes one electrode connected to the driving power supply line ELVDD and the other electrode connected to the first gate electrode G1 and the third drain electrode D3.

The OLED includes a first electrode, a second electrode positioned on the first electrode, and an organic emission layer positioned between the first electrode and the second electrode. The first electrode of the OLED is connected to each of the seventh source electrode S7 and a sixth drain electrode D6, and the second electrode of the OLED is connected to a common power supply ELVSS to which a common signal is transferred.

As an example of driving of one pixel PXn including the pixel circuit PC, the wirings Sn, Sn-1, Sn-2, EM, Vin, DA, and ELVDD, and the OLED described above, when the third scan signal is first transferred to the third scan line Sn-2 to turn on the seventh thin film transistor T7, a residual current flowing to the first electrode of the OLED exits to the fourth thin film transistor T4 through the seventh thin film transistor T7, such that unintended light emission of the OLED by the residual current flowing to the first electrode of the OLED is suppressed.

Next, when the second scan signal is transferred to the second scan line Sn-1 and an initialization signal is transferred to the initialization power supply line Vin, the fourth thin film transistor T4 is turned on, such that an initialization voltage by the initialization signal is transferred to the first gate electrode G1 of the first thin film transistor T1 and the other electrode of the capacitor Cst through the fourth thin film transistor T4. Therefore, the first gate electrode G1 and the capacitor Cst are initialized. In this case, the first thin film transistor T1 is turned on while the first gate electrode G1 being initialized.

Next, when the first scan signal is transferred to the first scan line Sn and the data signal is transferred to the data line DA, each of the second thin film transistor T2 and the third thin film transistor T3 is turned on, such that a data voltage (Vd) by the data signal is supplied to the first gate electrode G1 through the second thin film transistor T2, the first thin film transistor T1, and the third thin film transistor T3. In this case, a compensation voltage {Vd+Vth (here, Vth is a negative (−) value)}, which is the sum of the data voltage (Vd) first supplied from the data line DA and a threshold voltage (Vth) of the first thin film transistor T1, is supplied to the first gate electrode G1. The compensation voltage (Vd+Vth) supplied to the first gate electrode G1 is also supplied to the other electrode of the capacitor Cst connected to the first gate electrode G1.

Next, a driving voltage (Vel) by the driving signal from the driving power supply line ELVDD is supplied to one electrode of the capacitor Cst, and the above-mentioned compensation voltage (Vd+Vth) is supplied to the other electrode of the capacitor Cst, such that electric charges corresponding to the difference between the voltages each applied to both electrodes of the capacitor Cst are stored in the capacitor Cst, thereby turning on the first thin film transistor T1 for a predetermined time.

Next, when the emission control signal is applied to the emission control line EM, each of the fifth thin film transistor T5 and the sixth thin film transistor T6 is turned on, such that the driving voltage (Vel) by the driving signal from the driving power supply line ELVDD is supplied to the first thin film transistor T1 through the fifth thin film transistor T5.

In this case, while the driving voltage (Vel) passing through the first thin film transistor T1 turned on by the capacitor Cst, a driving current $I_d$ corresponding to a voltage difference between a voltage supplied to the first gate electrode G1 by the capacitor Cst and the driving voltage (Vel) flows to the first drain electrode D1 of the first thin film transistor T1 and is then supplied to the OLED through the sixth thin film transistor T6, such that the OLED emits light for a predetermined time.

Although the OLED display according to an exemplary embodiment includes the pixel circuit PC including the first thin film transistor T1 to the seventh thin film transistor T7 and the capacitor Cst and the first scan line Sn to the third scan line Sn-2, the data line DA, the driving power supply line ELVDD, and the initialization power supply line Vin connected to the pixel circuit, the described technology is not limited thereto. That is, a pixel circuit of an OLED display according to another exemplary embodiment includes a pixel circuit including a plurality of thin film transistors and at least one capacitor and wirings including at least one scan line and at least one driving power supply line connected to the pixel circuit.

Next, a layout of each of the first pixel PX1 positioned on the exterior area EA of the display area DIA of the substrate SUB and the second pixel PX2 positioned on the central area CA of the display area DIA of the substrate SUB among the pixels PXns of the OLED display according to an exemplary embodiment described above will be described with reference to FIGS. 3 to 6.

Insulating layers may be positioned between components to be described below, positioned on different layers. These insulating layers may be inorganic insulating layers or organic insulating layers formed of a silicon nitride, a silicon oxide, or the like. In addition, these insulating layers may be formed of a single layer or plural layers.

Figure 3:
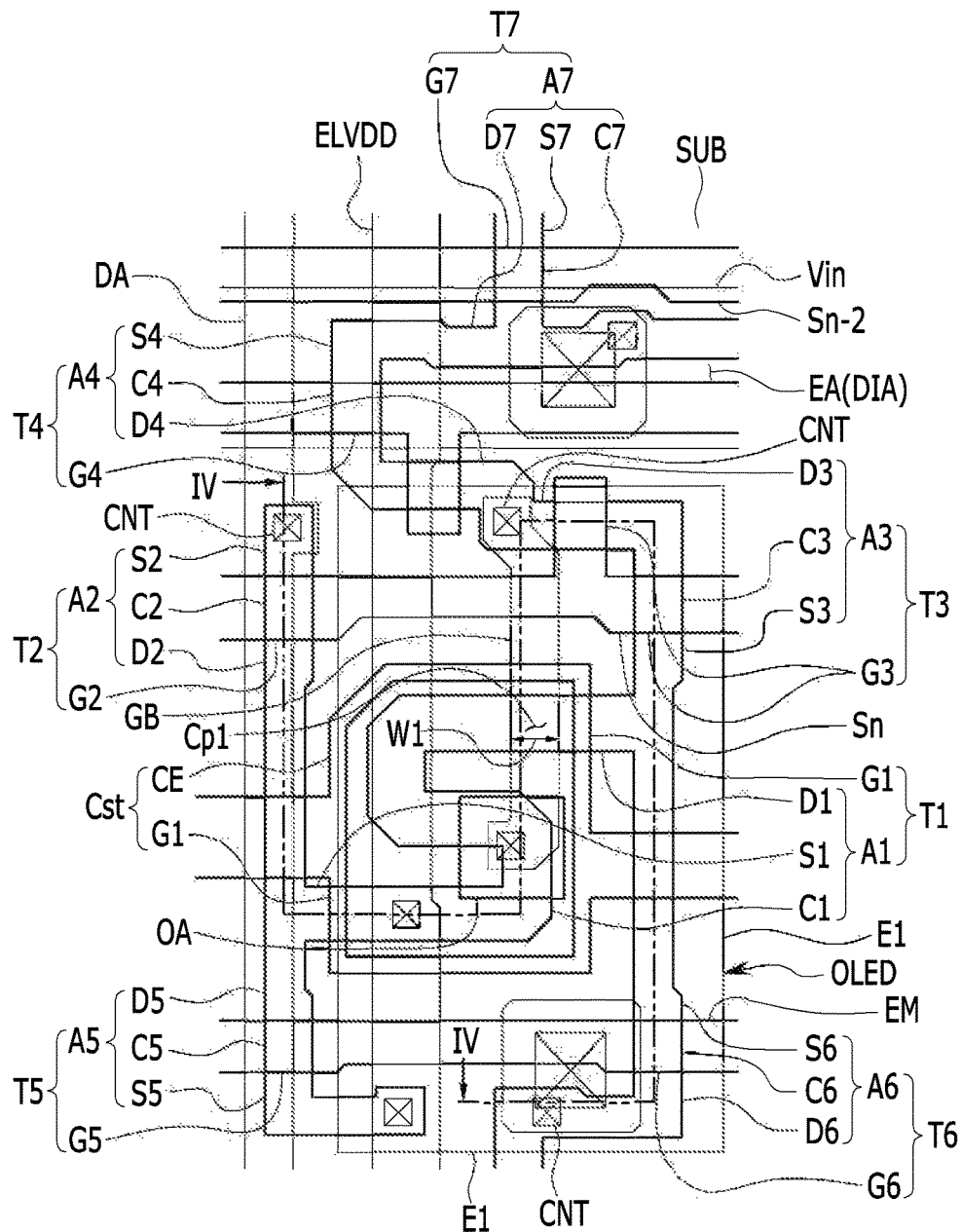
FIG. 3 is a layout view showing a first pixel of the OLED display according to an exemplary embodiment shown in FIG. 1.
Figure 4:
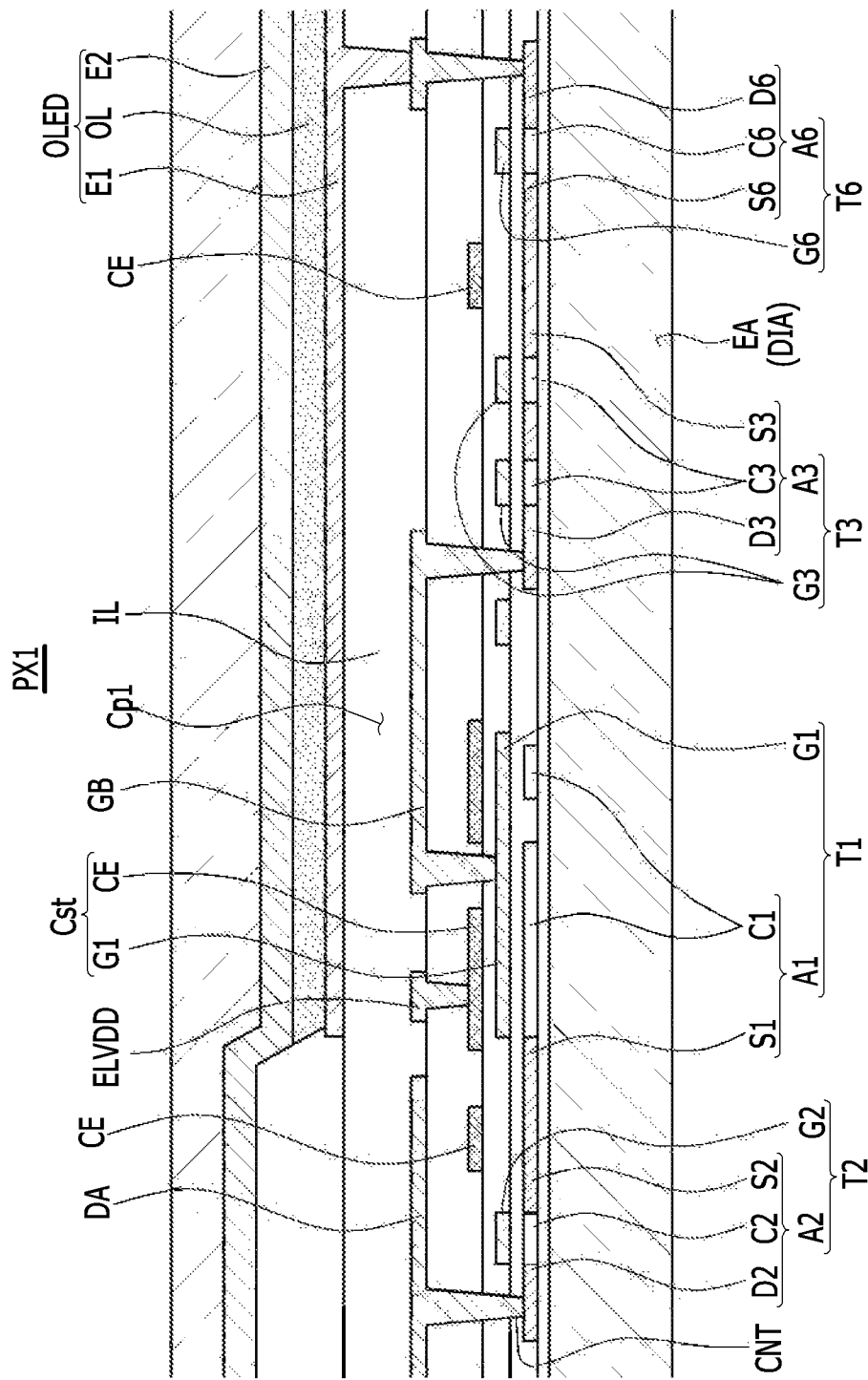
FIG. 4 is a cross-sectional view taken along line IV-IV of FIG. 3.

FIG. 3 is a layout view showing a first pixel of the OLED display according to an exemplary embodiment shown in FIG. 1. FIG. 4 is a cross-sectional view taken along line IV-IV of FIG. 3.

As shown in FIGS. 3 and 4, the first pixel PX1 positioned on the exterior area EA of the display area DIA of the substrate SUB includes a first thin film transistor T1, a second thin film transistor T2, a third thin film transistor T3, a fourth thin film transistor T4, a fifth thin film transistor T5, a sixth thin film transistor T6, a seventh thin film transistor T7, a first scan line Sn, a second scan line Sn-1, a third scan line Sn-2, an emission control line EM, a capacitor Cst, a data line DA, a driving power supply line ELVDD, a node line GB, an initialization power supply line Vin, and an OLED. Here, the first thin film transistor T1, the second thin film transistor T2, the third thin film transistor T3, the fourth thin film transistor T4, the fifth thin film transistor T5, the sixth thin film transistor T6, the seventh thin film transistor T7, which are a plurality of thin film transistors of the first pixel PX1, the node line GB, and the capacitor Cst may form the pixel circuit.

The first thin film transistor T1 is positioned on the substrate SUB, and includes a first active pattern A1 and a first gate electrode G1.

The first active pattern A1 includes a first source electrode S1, a first channel C1, and a first drain electrode D1. The first source electrode S1 is connected to each of a second drain electrode D2 of the second thin film transistor T2 and a fifth drain electrode D5 of the fifth thin film transistor T5. The first drain electrode D1 is connected to each of a third source electrode S3 of the third thin film transistor T3 and a sixth source electrode S6 of the sixth thin film transistor T6. The first channel C1, which is a channel region of the first active pattern A1 overlapping the first gate electrode G1, bends once or more and extends, and since the first channel C1 is bent once or more and extended within a space in which it is overlapping the first gate electrode G1, which is a limited space, the first channel C1 may be formed to be long. Therefore, a driving range of a gate voltage applied to the first gate electrode G1 may be formed to be wide. Therefore, a magnitude of the gate voltage applied to the first gate electrode G1 is changed within the wide driving range to more minutely control a gray of the light emitted from the OLED, thereby making it possible to improve quality of an image displayed from the OLED display. A shape of the first active pattern A1 may be variously changed. For example, a shape of the first active pattern A1 may be changed into various shapes such as a 'reverse S' shape, an 'S' shape, an 'M' shape, a 'W' shape, and the like.

The first active pattern A1 may be formed of poly-silicon or an oxide semiconductor. The oxide semiconductor may include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and a zinc oxide (ZnO), an indium-gallium-zinc oxide (In-GaZnO$_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof. In the case in which the first active pattern A1 is formed of the oxide semiconductor, a separate passivation layer may be added in order to protect the oxide semiconductor vulnerable to an external environment such as a high temperature, or the like.

The first channel C1 of the first active pattern A1 may be channel-doped with N-type impurities or P-type impurities. The first source electrode S1 and the first drain electrode D1 may be spaced apart from each other with the first channel C1 interposed therebetween and be doped with opposite type impurities to the impurities with which the first channel C1 is doped.

The first gate electrode G1 is positioned on the first channel C1 of the first active pattern A1 and has an island shape. The first gate electrode G1 is connected to a fourth drain electrode D4 of the fourth thin film transistor T4 and a third drain electrode D3 of the third thin film transistor T3 by a node line GB passing through contact holes CNT. The first gate electrode G1 overlaps a capacitor electrode CE, and may serve as the other electrode of the capacitor Cst substantially simultaneously (or concurrently) with serving as a gate electrode of the first thin film transistor T1. That is, the first gate electrode G1 forms the capacitor Cst together with the capacitor electrode (CE).

The second thin film transistor T2 is positioned on the substrate SUB, and includes a second active pattern A2 and a second gate electrode G2. The second active pattern A2 includes a second source electrode S2, a second channel C2, and the second drain electrode D2. The second source electrode S2 is connected to the data line DA through a contact hole CNT, and the second drain electrode D2 is connected to the first source electrode S1 of the first thin film transistor T1. The second channel C2, which is a channel region of the second active pattern A2 overlapping the second gate electrode G2, is positioned between the second source electrode S2 and the second drain electrode D2. That is, the second active pattern A2 is connected to the first active pattern A1.

The second channel C2 of the second active pattern A2 may be channel-doped with N-type impurities or P-type impurities. The second source electrode S2 and the second drain electrode D2 may be spaced apart from each other with the second channel C2 interposed therebetween and be doped with opposite type impurities to the impurities with which the second channel C2 is doped. The second active pattern A2 is positioned on the same layer as a layer on which the first active pattern A1 is positioned, is formed of the same material as that of the first active pattern A1, and is formed integrally with the first active pattern A1.

The second gate electrode G2 is positioned on the second channel C2 of the second active pattern A2, and is formed integrally with the first scan line Sn.

The third thin film transistor T3 is positioned on the substrate SUB, and includes a third active pattern A3 and a third gate electrode G3.

The third active pattern A3 includes the third source electrode S3, a third channel C3, and the third drain electrode D3. The third source electrode S3 is connected to the first drain electrode D1, and the third drain electrode D3 is connected to the first gate electrode G1 of the first thin film transistor T1 by a node line GB passing through a contact hole CNT. The third channel C3, which is a channel region of the third active pattern A3 overlapped with the third gate electrode G3, is positioned between the third source electrode S3 and the third drain electrode D3. That is, the third active pattern A3 connects between the first active pattern A1 and the first gate electrode G1.

The third channel C3 of the third active pattern A3 may be channel-doped with N-type impurities or P-type impurities, and the third source electrode S3 and the third drain electrode D3 may be spaced apart from each other with the third channel C3 interposed therebetween and be doped with opposite type impurities to the impurities with which the third channel C3 is doped. The third active pattern A3 is positioned on the same layer as a layer on which the first active pattern A1 and the second active pattern A2 are positioned, is formed of the same material as that of the first active pattern A1 and the second active pattern A2, and is formed integrally with the first active pattern A1 and the second active pattern A2.

The third gate electrode G3 is positioned on the third channel C3 of the third active layer A3, and is formed integrally with the first scan line Sn. The third gate electrode G3 is formed as a dual gate electrode.

The fourth thin film transistor T4 is positioned on the substrate SUB, and includes a fourth active pattern A4 and a fourth gate electrode G4.

The fourth active pattern A4 includes a fourth source electrode S4, a fourth channel C4, and the fourth drain electrode D4. The fourth source electrode S4 is connected to the initialization power supply line Vin through a contact hole, and the fourth drain electrode D4 is connected to the first gate electrode G1 of the first thin film transistor T1 by a node line GB passing through a contact hole. The fourth channel C4, which is a channel region of the fourth active pattern A4 overlapping the fourth gate electrode G4, is positioned between the fourth source electrode S4 and the fourth drain electrode D4. That is, the fourth active pattern A4 is connected to each of the third active pattern A3 and the first gate electrode G1 substantially simultaneously (or concurrently) with connecting between the initialization power supply line Vin and the first gate electrode G1.

The fourth channel C4 of the fourth active pattern A4 may be channel-doped with N-type impurities or P-type impurities, and the fourth source electrode S4 and the fourth drain electrode D4 may be spaced apart from each other with the fourth channel C4 interposed therebetween and be doped with opposite type impurities to the impurities with which the fourth channel C4 is doped. The fourth active pattern A4 is positioned on the same layer as a layer on which the first active pattern A1, the second active pattern A2, and the third active pattern A3 are positioned, is formed of the same material as that of the first active pattern A1, the second active pattern A2, and the third active pattern A3, and is formed integrally with the first active pattern A1, the second active pattern A2, and the third active pattern A3.

The fourth gate electrode G4 is positioned on the fourth channel C4 of the fourth active pattern A4, and is formed integrally with the second scan line Sn-1. The fourth gate electrode G4 is formed as a dual gate electrode.

The fifth thin film transistor T5 is positioned on the substrate SUB, and includes a fifth active layer A5 and a fifth gate electrode G5.

The fifth active pattern A5 includes a fifth source electrode S5, a fifth channel C5, and the fifth drain electrode D5. The fifth source electrode S5 is connected to the driving power supply line ELVDD through a contact hole CNT, and the fifth drain electrode D5 is connected to the first source electrode S1 of the first thin film transistor T1. The fifth channel C5, which is a channel region of the fifth active pattern A5 overlapping the fifth gate electrode G5, is positioned between the fifth source electrode S5 and the fifth drain electrode D5. That is, the fifth active pattern A5 connects between the driving power supply line ELVDD and the first active pattern A1.

The fifth channel C5 of the fifth active pattern A5 may be channel-doped with N-type impurities or P-type impurities, and the fifth source electrode S5 and the fifth drain electrode D5 may be spaced apart from each other with the fifth channel C5 interposed therebetween and be doped with opposite type impurities to the impurities with which the fifth channel C5 is doped. The fifth active pattern A5 is positioned on the same layer as a layer on which the first active pattern A1, the second active pattern A2, the third active pattern A3, and the fourth active pattern A4 are positioned, is made of the same material as that of the first active pattern A1, the second active pattern A2, the third active pattern A3, and the fourth active pattern A4, and is formed integrally with the first active pattern A1, the second active pattern A2, the third active pattern A3, and the fourth active pattern A4.

The fifth gate electrode G5 is positioned on the fifth channel C5 of the fifth active pattern A5, and is formed integrally with the emission control line EM.

The sixth thin film transistor T6 is positioned on the substrate SUB, and includes a sixth active pattern A6 and a sixth gate electrode G6.

The sixth active pattern A6 includes the sixth source electrode S6, a sixth channel C6, and the sixth drain electrode D6. The sixth source electrode S6 is connected to the first drain electrode D1 of the first thin film transistor T1, and the sixth drain electrode D6 is connected to a first electrode E1 of the OLED through a contact hole CNT. The sixth channel C6, which is a channel region of the sixth active pattern A6 overlapping the sixth gate electrode G6, is positioned between the sixth source electrode S6 and the sixth drain electrode D6. That is, the sixth active pattern A6 connects between the first active pattern A1 and the first electrode E1 of the OLED.

The sixth channel C6 of the sixth active pattern A6 may be channel-doped with N-type impurities or P-type impurities, and the sixth source electrode S6 and the sixth drain electrode D6 may be spaced apart from each other with the sixth channel C6 interposed therebetween and be doped with opposite type impurities to the impurities with which the sixth channel C6 is doped. The sixth active pattern A6 is positioned on the same layer as a layer on which the first active pattern A1, the second active pattern A2, the third active pattern A3, the fourth active pattern A4, and the fifth active pattern A5 are positioned. The sixth active pattern A6 is formed of the same material as that of the first active pattern A1, the second active pattern A2, the third active pattern A3, the fourth active pattern A4, and the fifth active pattern A5 The sixth active pattern A6 is formed integrally with the first active pattern A1, the second active pattern A2, the third active pattern A3, the fourth active pattern A4, and the fifth active pattern A5.

The sixth gate electrode G6 is positioned on the sixth channel C6 of the sixth active pattern A6, and is formed integrally with the emission control line EM.

The seventh thin film transistor T7 is positioned on the substrate SUB, and includes a seventh active pattern A7 and a seventh gate electrode G7.

The seventh active pattern A7 includes a seventh source electrode S7, a seventh channel C7, and a seventh drain electrode D7. The seventh source electrode S7 is connected to a first electrode of an OLED of another pixel (not shown in FIG. 3) (that may be a pixel positioned above the pixel shown in FIG. 2), and the seventh drain electrode D7 is connected to the fourth source electrode S4 of the fourth thin film transistor T4. The seventh channel C7, which is a channel region of the seventh active pattern A7 overlapping the seventh gate electrode G7, is positioned between the seventh source electrode S7 and the seventh drain electrode D7. That is, the seventh active pattern A7 connects between the first electrode of the OLED and the fourth active pattern A4.

The seventh channel C7 of the seventh active pattern A7 may be channel-doped with N-type impurities or P-type impurities, and the seventh source electrode S7 and the seventh drain electrode D7 may be spaced apart from each other with the seventh channel C7 interposed therebetween and be doped with opposite type impurities to the impurities with which the seventh channel C7 is doped. The seventh active pattern A7 is positioned on the same layer as a layer on which the first active pattern A1, the second active pattern A2, the third active pattern A3, the fourth active pattern A4, the fifth active pattern A5, and the sixth active pattern A6 are positioned. The seventh active pattern A7 is made of the same material as that of the first active pattern A1, the second active pattern A2, the third active pattern A3, the fourth active pattern A4, the fifth active pattern A5, and the sixth active pattern A6. The seventh active pattern A7 is formed integrally with the first active pattern A1, the second active pattern A2, the third active pattern A3, the fourth active pattern A4, the fifth active pattern A5, and the sixth active pattern A6.

The seventh gate electrode G7 is positioned on the seventh channel C7 of the seventh active pattern A7, and is formed integrally with the third scan line Sn-2.

A plurality of insulating layers are sequentially stacked on the first active pattern A1, the second active pattern A2, the third active pattern A3, the fourth active pattern A4, the fifth active pattern A5, the sixth active pattern A6, and the seventh active pattern A7. Each of the insulating layers may be an inorganic insulating layer or an organic insulating layer made of a silicon nitride, a silicon oxide, or the like. In addition, these insulating layers may be formed of a single layer or plural layers.

The first scan line Sn is positioned on the second active pattern A2 and the third active pattern A3, extends in one direction traversing the second active pattern A2 and the third active pattern A3, and is formed integrally with the second gate electrode G2 and the third gate electrode G3 to be connected to the second gate electrode G2 and the third gate electrode G3.

The second scan line Sn-1 is positioned on the fourth active pattern A4 so as to be spaced apart from the first scan line Sn, extends in one direction traversing the fourth active pattern A4, and is formed integrally with the fourth gate electrode G4 to be connected to the fourth gate electrode G4.

The third scan line Sn-2 is positioned on the seventh active pattern A7 so as to be spaced apart from the second scan line Sn-1, extends in one direction traversing the seventh active pattern A7, and is formed integrally with the seventh gate electrode G7 to be connected to the seventh gate electrode G7.

The emission control line EM is positioned on the fifth active pattern A5 and the sixth active pattern A6 so as to be spaced apart from the first scan line Sn, extends in one direction traversing the fifth active pattern A5 and the sixth active pattern A6, and is formed integrally with the fifth gate electrode G5 and the sixth gate electrode G6 to be connected to the fifth gate electrode G5 and the sixth gate electrode G6.

The emission control line EM, the third scan line Sn-2, the second scan line Sn-1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 described above are positioned on the same layer and are formed of the same material. Meanwhile, in another exemplary embodiment, alternatively, the emission control line EM, the third scan line Sn-2, the second scan line Sn-1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 may be positioned on different layers and be formed of different materials.

The capacitor Cst includes one electrode and the other electrode facing each other with an insulating layer interposed therebetween. The above-mentioned one electrode may be the capacitor electrode CE, and the other electrode may be the first gate electrode G1. The capacitor electrode CE may be positioned on the first gate electrode G1, and be connected to the driving power supply line ELVDD through a contact hole.

The capacitor electrode CE forms the capacitor Cst together with the first gate electrode G1, and the first gate electrode G1 and the capacitor electrode CE may be formed using different metals or the same metal on different layers.

The capacitor electrode CE includes an opening OA exposing a portion of the first gate electrode G1, and the node line GB is connected to the first gate electrode G1 through the opening OA.

The data line DA is positioned on the first scan line Sn, extends in the other direction traversing the first scan line Sn, and is connected to the second source electrode S2 of the second active layer A2 through a contact hole CNT. The data line DA extends while traversing the first scan line Sn, the second scan line Sn-1, the third scan line Sn-2, and the emission control line EM.

The driving power supply line ELVDD is positioned on the first scan line Sn so as to be spaced apart from the data line DA, extends in the other direction traversing the first scan line Sn, and is connected to the fifth source electrode S5 of the fifth active pattern A5 connected to the capacitor electrode CE and the first active pattern A1 through a contact hole CNT. The driving power supply line ELVDD extends while traversing the first scan line Sn, the second scan line Sn-1, the third scan line Sn-2, and the emission control line EM.

The node line GB is positioned on the first scan line Sn so as to be spaced apart from the driving power supply line ELVDD, and is connected to each of the third drain electrode D3 of the third active pattern A3 and the fourth drain electrode D4 of the fourth active pattern A4 through contact holes CNTs to be connected to the first gate electrode G1 exposed by the opening OA of the capacitor electrode CE through the contact hole. That is, the node line GB connects between the first thin film transistor T1, which is any one of the first thin film transistor T1 to the seventh thin film transistor T7 corresponding to the plurality of thin film transistors, and the third thin film transistor T3, which is another of the first thin film transistor T1 to the seventh thin film transistor T7. The node line GB also connects between the first thin film transistor T1, which is any one of the first thin film transistor T1 to the seventh thin film transistor T7, and the fourth thin film transistor T4, which is still another of the first thin film transistor T1 to the seventh thin film transistor T7. The node line GB is positioned between the first electrode E1, which is an electrode of the OLED, and the capacitor electrode CE and extends in one direction at a first width W1.

The node line GB is overlapping the first electrode E1, which is the electrode of the OLED, and one insulating layer IL is positioned between the node line GB and the first electrode E1. Therefore, a first parasitic capacitance Cp1 having a magnitude corresponding to a region in which the node line GB and the first electrode E1 are overlapping each other is formed in the insulating layer IL between the node line GB and the first electrode E1, and a current flowing to the first electrode E1 is increased proportionally to the first parasitic capacitance Cp1.

Although the node line GB entirely overlaps the first electrode E1 in an exemplary embodiment, the node line may partially overlap the first electrode in another exemplary embodiment. That is, a portion or more of the node line GB may be overlapping the first electrode E1.

The node line GB, the data line DA, and the driving power supply line ELVDD described above are positioned on the same layer and are formed of the same material. Meanwhile, in another exemplary embodiment, alternatively, the data line DA, the driving power supply line ELVDD, and the node line GB may be positioned on different layers and be formed of different materials.

The initialization power supply line Vin is positioned on the second scan line Sn-1, and is connected to the fourth source electrode S4 of the fourth active pattern A4 through a contact hole. The initialization power supply line Vin is positioned on the same layer as a layer on which the first electrode E1 of the OLED is positioned and is formed of the same material as that of the first electrode E1. Meanwhile, in another exemplary embodiment, the initialization power supply line Vin may be positioned on a layer different from the layer on which the first electrode E1 is positioned and be formed of a material different from that of the first electrode E1.

The OLED includes the first electrode E1, an organic emission layer OL, and a second electrode E2. The first electrode E1 is connected to the sixth drain electrode D6 of the sixth thin film transistor T6 through a contact hole CNT. The organic emission layer OL is positioned between the first electrode E1 and the second electrode E2. The second electrode E2 is positioned on the organic emission layer OL. One or more of the first electrode E1 and the second electrode E2 may be any one or more of a light transmitting electrode, a light reflective electrode, and a light transflective electrode, and light emitted from the organic emission layer OL may be emitted toward any one or more of the first electrode E1 and the second electrode E2.

A capping layer covering the OLED may be positioned on the OLED, and a thin film encapsulation layer or an encapsulation substrate may be positioned on the OLED with the capping layer interposed therebetween.

The second pixel PX2 is positioned on the central area CA of the display area DIA of the substrate SUB so as to be spaced apart from the first pixel PX1 positioned on the exterior area EA of the display area DIA of the substrate SUB.

Figure 5:
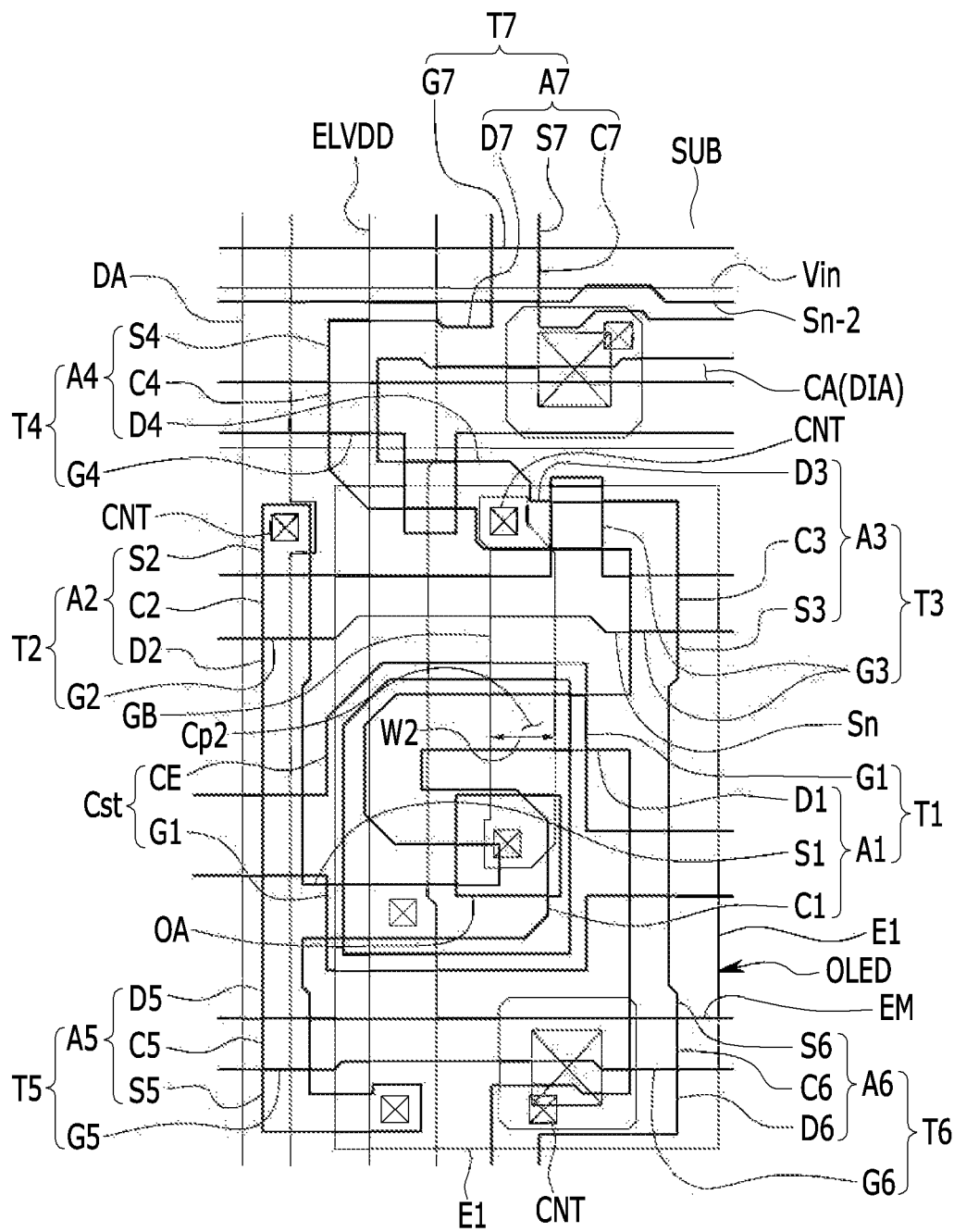
FIG. 5 is a layout view showing a second pixel of the OLED display according to an exemplary embodiment shown in FIG. 1.

FIG. 5 is a layout view showing a second pixel of the OLED display according to an exemplary embodiment shown in FIG. 1.

Next, portions of the second pixel PX2 different from those of the first pixel PX1 described above will be described.

As shown in FIG. 5, the second pixel PX2 positioned on the central area CA of the display area DIA of the substrate SUB includes a first thin film transistor T1, a second thin film transistor T2, a third thin film transistor T3, a fourth thin film transistor T4, a fifth thin film transistor T5, a sixth thin film transistor T6, a seventh thin film transistor T7, a first scan line Sn, a second scan line Sn-1, a third scan line Sn-2, an emission control line EM, a capacitor Cst, a data line DA, a driving power supply line ELVDD, a node line GB, an initialization power supply line Vin, and an OLED. Here, the first thin film transistor T1, the second thin film transistor T2, the third thin film transistor T3, the fourth thin film transistor T4, the fifth thin film transistor T5, the sixth thin film transistor T6, the seventh thin film transistor T7, which are a plurality of thin film transistors of the second pixel PX2, the node line GB, and the capacitor Cst may form the pixel circuit.

The node line GB of the second pixel PX2 is positioned on the first scan line Sn so as to be spaced apart from the driving power supply line ELVDD, and is connected to each of the third drain electrode D3 of the third active pattern A3 and the fourth drain electrode D4 of the fourth active pattern A4 through contact holes CNTs to be connected to the first gate electrode G1 exposed by the opening OA of the capacitor electrode CE through the contact hole. That is, the node line GB connects between the first thin film transistor T1, which is any one of the first thin film transistor T1 to the seventh thin film transistor T7 corresponding to the thin film transistors, and the third thin film transistor T3, which is another of the first thin film transistor T1 to the seventh thin film transistor T7, and between the first thin film transistor T1, which is any one of the first thin film transistor T1 to the seventh thin film transistor T7, and the fourth thin film transistor T4, which is still another of the first thin film transistor T1 to the seventh thin film transistor T7. The node line GB is positioned between the first electrode E1, which is an electrode of the OLED, and the capacitor electrode CE and extends in one direction at a second width W2 greater than the first width W1 of the node line GB of the first pixel PX1 described above.

The node line GB overlaps the first electrode E1, which is the electrode of the OLED, a second parasitic capacitance Cp2 having a magnitude corresponding to a region in which the node line GB and the first electrode E1 are overlapping each other is formed in an insulating layer between the node line GB and the first electrode E1, and a current flowing to the first electrode E1 is increased in proportion to the second parasitic capacitance Cp2.

The node line GB of the second pixel PX2 extends in one direction at the second width W2 greater than the first width W1 of the node line GB of the first pixel PX1 described above and overlaps the first electrode E1, such that the node line GB of the second pixel PX2 is overlapping the first electrode E1 of the OLED at an area greater than that of the node line GB of the first pixel PX1 described above. Therefore, the second parasitic capacitance Cp2 formed in the second pixel PX2 is larger than the first parasitic capacitance Cp1 formed in the first pixel PX1.

As described above, the second parasitic capacitance Cp2 formed in the second pixel PX2 is greater than the first parasitic capacitance Cp1 formed in the first pixel PX1, such that a current flowing to the first electrode E1 of the second pixel PX2 further rises compared to the first electrode E1 of the first pixel PX1 due to the parasitic capacitance.

Although only the first pixel PX1 and the second pixel PX2, which are two pixels PXns, have been described in an exemplary embodiment, magnitudes of parasitic capacitances formed between the node line of each pixel and the first electrode may gradually larger as the pixel becomes distant from the data driver DD in another exemplary embodiment.

As described above, in the OLED display according to an exemplary embodiment, the second parasitic capacitance Cp2 formed between the node line GB of the second pixel PX2 positioned on the central area CA of the display area DIA and the first electrode E1 is larger than the first parasitic capacitance Cp1 formed between the node line GB of the first pixel PX1 positioned on the exterior area EA of the display area DIA and the first electrode E1, such that generation of an unintended deviation between currents supplied to the OLED of the second pixel PX2 and the OLED of the first pixel PX1 is suppressed.

For example, a voltage of the data signal supplied from the data driver DD to each pixel PXn through the data line further drops as the pixel becomes distant from the data driver DD due to an electrical resistance. However, the second parasitic capacitance Cp2 formed between the first electrode E1 of the OLED and the node line GB in the second pixel PX2 positioned on the central area CA of the display area DIA spaced apart from the data driver DD is larger than the first parasitic capacitance Cp1 formed between the first electrode E1 of the OLED and the node line GB in the first pixel PX1 positioned on the exterior area EA of the display area DIA neighboring the data driver DD, such that a current flowing to the first electrode E1 of the second pixel PX2 further rises compared to the first pixel PX1 due to the parasitic capacitance. Therefore, a voltage drop of the data signal through the data line DA is compensated for by the parasitic capacitance, thereby making it possible to suppress an unintended deviation from being generated between currents supplied to a plurality of OLEDs formed over the entire substrate SUB.

Therefore, a luminance difference between the OLEDs formed over the entire substrate SUB is minimized, such that an OLED display in which deterioration of display quality of an image is minimized is provided.

Accordingly, an OLED display in which generation of a difference between values of currents supplied to the plurality of OLEDs formed over the entire substrate SUB is suppressed even though a voltage drop is generated in a signal supplied to an OLED distant from a position to which an initial signal is supplied among the plurality of OLEDs formed over the entire substrate SUB is provided.

Next, an OLED display according to another exemplary embodiment will be described with reference to FIGS. 6 and 7. Hereinafter, components different from those of the OLED display according to an exemplary embodiment described above will be described.

Figure 6:
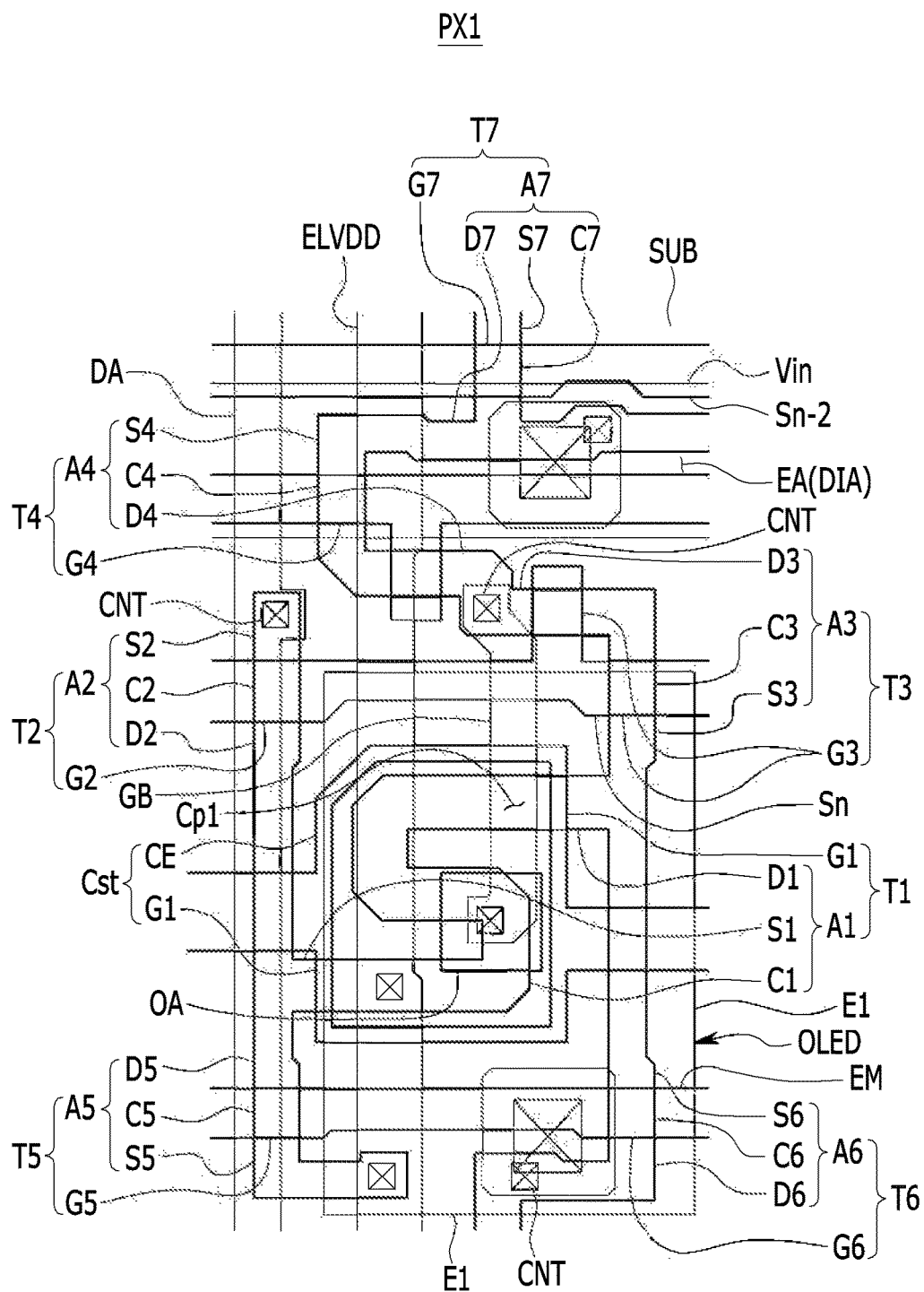
FIG. 6 is a layout view showing a first pixel of an OLED display according to another exemplary embodiment.

FIG. 6 is a layout view showing a first pixel of an OLED display according to another exemplary embodiment. FIG. 7 is a layout view showing a second pixel of the OLED display according to another exemplary embodiment.

Figure 7:
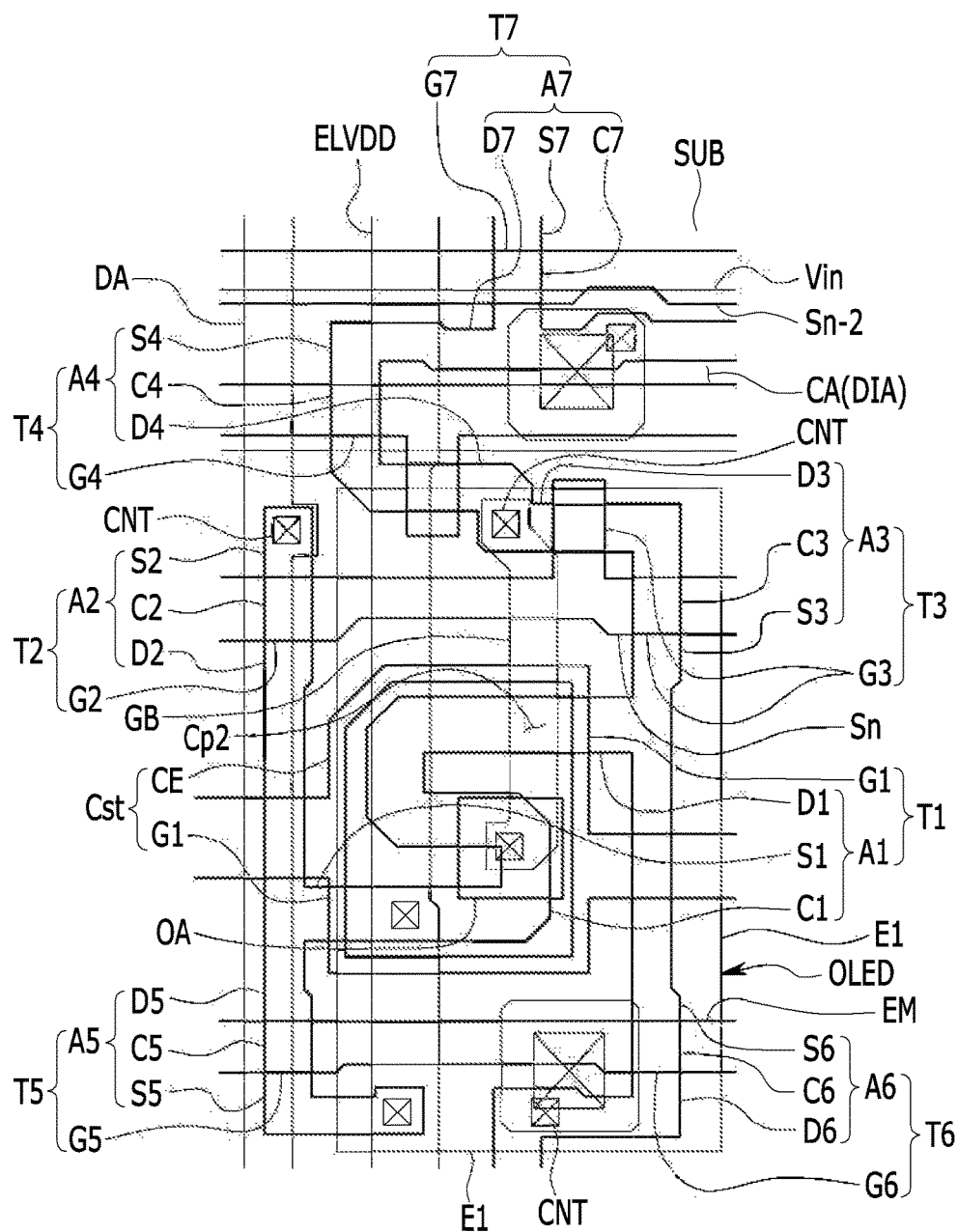
FIG. 7 is a layout view showing a second pixel of the OLED display according to another exemplary embodiment.

As shown in FIGS. 6 and 7, an area of the first electrode E1 overlapping the node line GB of the second pixel PX2 of the OLED display according to another exemplary embodiment is formed to be greater than that of the first electrode E1 overlapping the node line GB of the first pixel PX1. That is, an area of a first electrode E1, which is one electrode overlapping the node line GB of the second pixel PX2, which is one pixel, among a plurality of first electrodes E1, which are a plurality of electrodes formed over the entire substrate SUB, is formed to be greater than that of a first electrode E1, which is the other electrode overlapping the node line GB of the first pixel PX1, which is another pixel. Therefore, the second parasitic capacitance Cp2 formed in the second pixel PX2 is larger than the first parasitic capacitance Cp1 formed in the first pixel PX1.

As described above, the second parasitic capacitance Cp2 formed in the second pixel PX2 is larger than the first parasitic capacitance Cp1 formed in the first pixel PX1, such that a current flowing to the first electrode E1 of the second pixel PX2 further rises compared to the first electrode E1 of the first pixel PX1 due to the parasitic capacitance.

As described above, in the OLED display according to another exemplary embodiment, the second parasitic capacitance Cp2 formed between the node line GB of the second pixel PX2 positioned on the central area CA of the display area DIA and the first electrode E1 is larger than the first parasitic capacitance Cp1 formed between the node line GB of the first pixel PX1 positioned on the exterior area EA of the display area DIA and the first electrode E1, such that generation of an unintended deviation between currents supplied to the OLED of the second pixel PX2 and the OLED of the first pixel PX1 is suppressed. Therefore, a luminance difference between the OLEDs formed over the entire substrate SUB is minimized, such that an OLED display in which deterioration of display quality of an image is minimized is provided.

Accordingly, an OLED display in which generation of a difference between values of currents supplied to the OLEDs formed over the entire substrate SUB is suppressed even though a voltage drop is generated in a signal supplied to an OLED distant from a position to which an initial signal is supplied among the pl OLEDs formed over the entire substrate SUB is provided.

Next, an OLED display according to another exemplary embodiment will be described with reference to FIGS. 8 and 9. Hereinafter, components different from those of the display according to an exemplary embodiment described above will be described.

Figure 8:
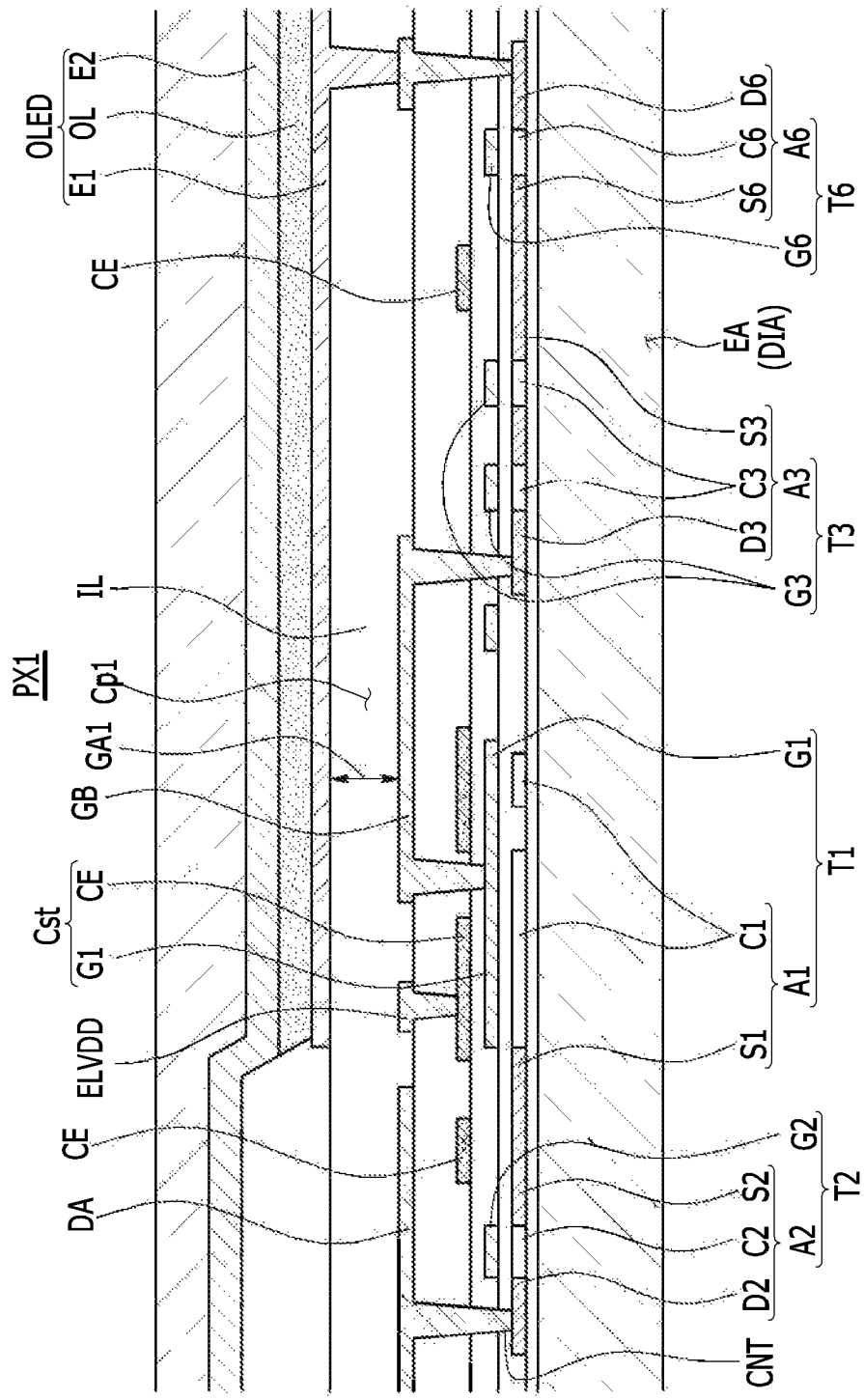
FIG. 8 is a cross-sectional view showing the first pixel of the OLED display according to another exemplary embodiment.

FIG. 8 is a cross-sectional view showing the first pixel of the OLED display according to another exemplary embodiment. FIG. 9 is a cross-sectional view showing the second pixel of the OLED display according to another exemplary embodiment.

Figure 9:
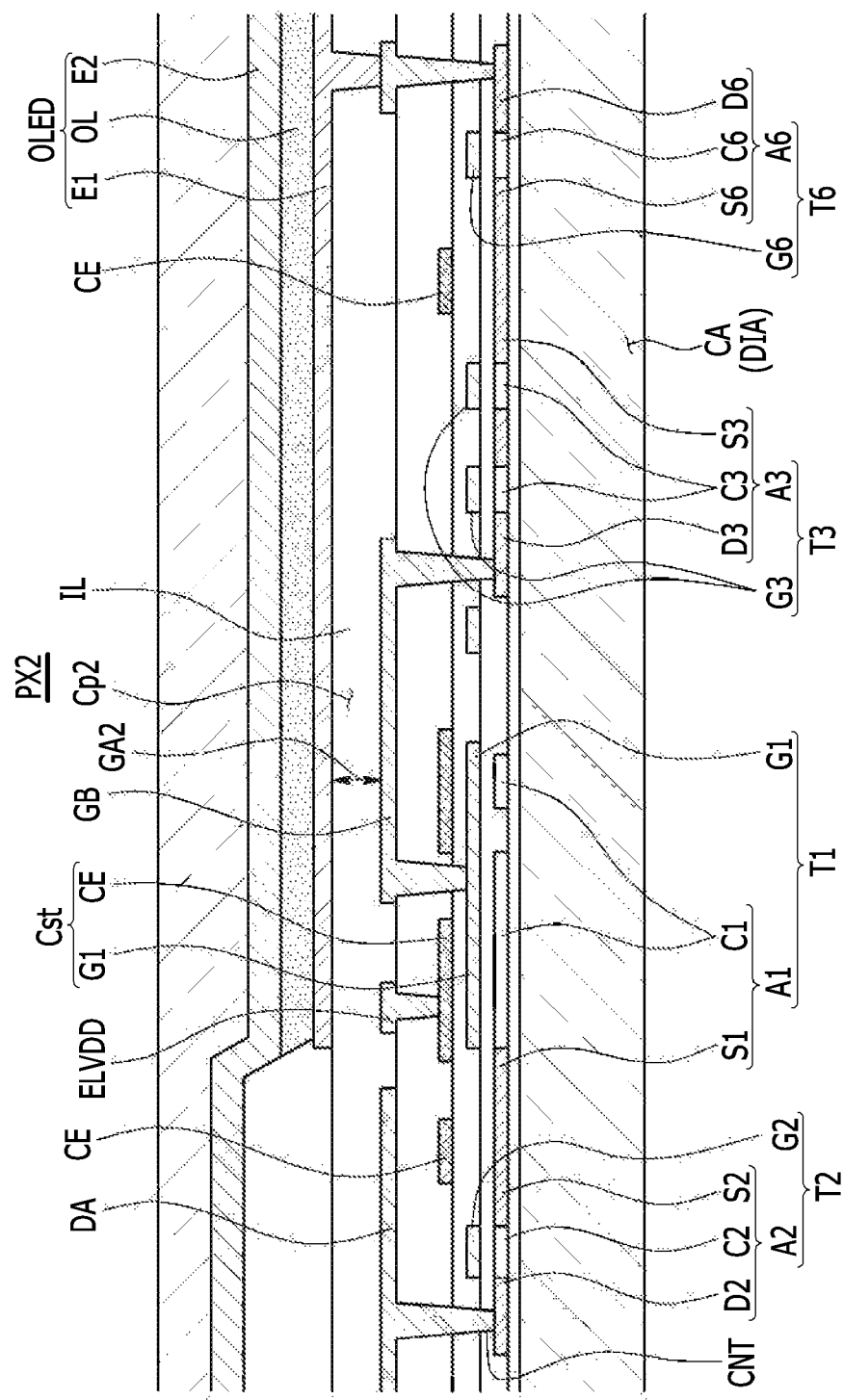
FIG. 9 is a cross-sectional view showing the second pixel of the OLED display according to another exemplary embodiment.

As shown in FIGS. 8 and 9, in the OLED display according to another exemplary embodiment, a second gap GA2, which is a gap between the node line GB of the second pixel PX2 and the first electrode E1, is formed to be narrower than a first gap GA1, which is a gap between the node line GB of the first pixel PX1 and the first electrode E1. That is, a gap between with the node line GB of the second pixel PX, which is one pixel, and a first electrode E1 among a plurality of first electrodes E1, which are a plurality of electrodes formed over the entire substrate SUB, is formed to be narrower than a gap between the node line GB of the first pixel PX1, which is the other pixel, and a first electrode E1. Therefore, the second parasitic capacitance Cp2 formed in the second pixel PX2 is larger than the first parasitic capacitance Cp1 formed in the first pixel PX1.

As described above, the second parasitic capacitance Cp2 formed in the second pixel PX2 is larger than the first parasitic capacitance Cp1 formed in the first pixel PX1, such that a current flowing to the first electrode E1 of the second pixel PX2 further rises as compared with the first electrode E1 of the first pixel PX1 due to the parasitic capacitance.

As described above, in the OLED display according to another exemplary embodiment, the second parasitic capacitance Cp2 formed between the node line GB of the second pixel PX2 positioned on the central area CA of the display area DIA and the first electrode E1 is larger than the first parasitic capacitance Cp1 formed between the node line GB of the first pixel PX1 positioned on the exterior area EA of the display area DIA and the first electrode E1, such that generation of an unintended deviation between currents supplied to the OLED of the second pixel PX2 and the OLED of the first pixel PX1 is suppressed.

Therefore, a luminance difference between the OLEDs formed over the entire substrate SUB is minimized, such that an OLED display in which deterioration of display quality of an image is minimized is provided.

Accordingly, an OLED display in which generation of a difference between values of currents supplied to the OLEDs formed over the entire substrate SUB is suppressed even though a voltage drop is generated in a signal supplied to an OLED distant from a position to which an initial signal is supplied among the OLEDs formed over the entire substrate SUB is provided.

Next, an OLED display according to another exemplary embodiment will be described with reference to FIGS. 10 and 11. Hereinafter, components different from those of the OLED display according to an exemplary embodiment described above will be described.

Figure 10:
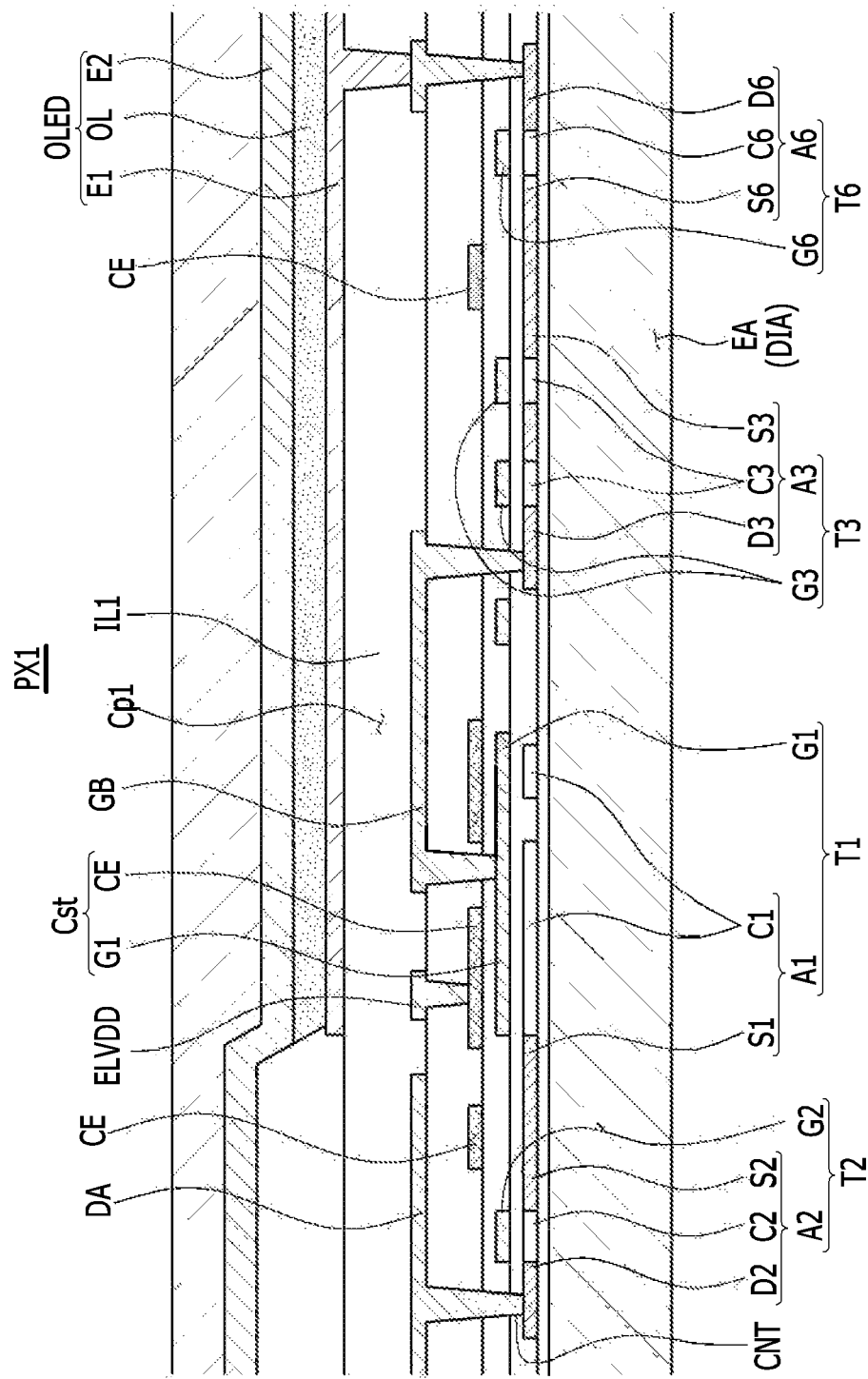
FIG. 10 is a cross-sectional view showing the first pixel of the OLED display according to another exemplary embodiment.

FIG. 10 is a cross-sectional view showing the first pixel of the OLED display according to another exemplary embodiment. FIG. 11 is a cross-sectional view showing the second pixel of the OLED display according to another exemplary embodiment.

Figure 11:
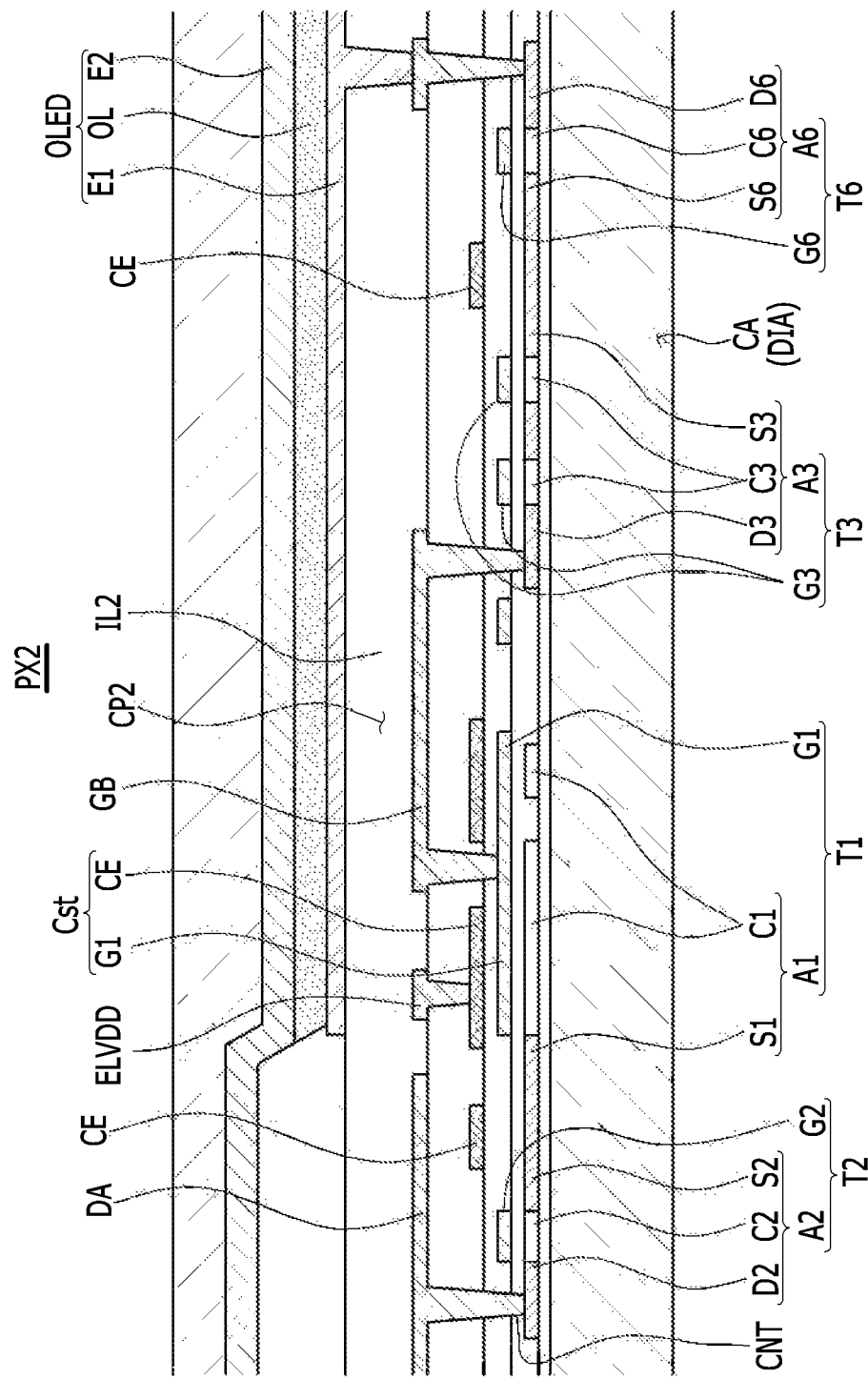
FIG. 11 is a cross-sectional view showing the second pixel of the OLED display according to another exemplary embodiment.

As shown in FIGS. 10 and 11, in the OLED display according to another exemplary embodiment, a dielectric constant of a second insulating layer IL2 positioned between the node line GB of the second pixel PX2 and the first electrode E1, is greater than that of a first insulating layer IL1 positioned between the node line GB of the first pixel PX1 and the first electrode E1. That is, the dielectric constant of the second insulating layer IL2, which is one insulating layer positioned between the node line GB of the second pixel PX, which is one pixel, and a first electrode E1 among a plurality of first electrodes E1, which are a plurality of electrodes formed over the entire substrate SUB, is larger than that of the first insulating layer IL1, which is the other insulating layer positioned between the node line GB of the first pixel PX1, which is another pixel, and a first electrode E1. Therefore, the second parasitic capacitance Cp2 formed in the second pixel PX2 is larger than the first parasitic capacitance Cp1 formed in the first pixel PX1.

For example, the first insulating layer IL1 and the second insulating layer IL2 may be formed of a signal layer or plural layers, respectively, and be formed integrally with each other or be formed as different layers. In the case in which the second insulating layer IL2 is formed of the plural layers, the second insulating layer IL2 may further include at least one layer distinguished from the first insulating layer IL1 and having a high dielectric constant.

As described above, the second parasitic capacitance Cp2 formed in the second pixel PX2 is larger than the first parasitic capacitance Cp1 formed in the first pixel PX1, such that a current flowing to the first electrode E1 of the second pixel PX2 further rises as compared with the first electrode E1 of the first pixel PX1 due to the parasitic capacitance.

As described above, in the OLED display according to another exemplary embodiment, the second parasitic capacitance Cp2 formed between the node line GB of the second pixel PX2 positioned on the central area CA of the display area DIA and the first electrode E1 is larger than the first parasitic capacitance Cp1 formed between the node line GB of the first pixel PX1 positioned on the exterior area EA of the display area DIA and the first electrode E1, such that generation of an unintended deviation between currents supplied to the OLED of the second pixel PX2 and the OLED of the first pixel PX1 is suppressed.

Therefore, a luminance difference between the OLEDs formed over the entire substrate SUB is minimized, such that an OLED display in which deterioration of display quality of an image is minimized is provided.

According to at least one of the disclosed embodiments, an OLED display in which generation of a difference between values of currents supplied to the OLEDs formed over the entire substrate SUB is suppressed even though a voltage drop is generated in a signal supplied to an OLED distant from a position to which an initial signal is supplied among the OLEDs formed over the entire substrate SUB is provided.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
    a substrate including a display area configured to display an image and a non-display area surrounding the display area, wherein the display area includes a first area and an second area, and wherein the second area is closer to the non-display area than the first area;
    a plurality of OLEDs positioned in the display area, wherein each of the OLEDs includes an electrode; and
    a plurality of pixel circuits positioned in the display area, wherein the pixel circuits include a first pixel circuit located in the first area and a second pixel circuit located in the second area, and wherein the node line of the first pixel circuit overlaps the corresponding electrode in an area greater than an area at which the node line of the second pixel circuit overlaps the corresponding electrode in the depth dimension of the OLED display; and
    wherein each of the pixel circuits includes i) a plurality of thin film transistors (TFTs) electrically connected to the OLEDs and ii) a node line electrically connected to at least two of the TFTs and at least partially overlapping the corresponding electrode in the depth dimension of the OLED display so as to form a parasitic capacitor, wherein the parasitic capacitor includes a first parasitic capacitor formed in the first area and a second parasitic capacitor formed in the second area,
    wherein the first parasitic capacitor has a larger capacitance than that of the second parasitic capacitor.

2. The OLED display of claim 1, wherein the node line of the first pixel circuit has a width greater than that of the node line of the second pixel circuit.

3. The OLED display of claim 1, wherein an area of the electrode overlapping the node line of the first pixel circuit is greater than that of the electrode overlapping the node line of the second pixel circuit.

4. The OLED display of claim 1, wherein a gap between a node line of the first pixel circuit and the corresponding electrode is narrower than that between a node line of the second pixel circuit and the corresponding electrode.

5. The OLED display of claim 1, further comprising an insulating layer formed in the first area and the external area, wherein the insulating layer is interposed between a node line of the first pixel circuit and the corresponding electrode, and wherein the dielectric constant of the insulating layer in the first area is greater than that of the insulating layer in the second area.

6. The OLED display of claim 1, wherein the OLED display further comprises:
    a plurality of data lines extending in a first direction over the substrate and electrically connected to the TFTs; and
    a data driver positioned in the non-display area and electrically connected to the data lines,
    wherein the second area is adjacent to the data driver.

7. The OLED display of claim 6, wherein the TFTs include:
    a first TFT formed over the substrate and including i) a first active pattern electrically connected to the OLED and ii) a first gate electrode positioned over the first active pattern;
    a second TFT including i) a second active pattern electrically connected to a first end of the first active pattern to be electrically connected to the data line and ii) a second gate electrode positioned over the second active pattern; and
    a third thin film transistor including i) a third active pattern electrically connected to a second end of the first active pattern to be electrically connected to the first gate electrode via the node line and ii) a third gate electrode positioned over the third active pattern.

8. The OLED display of claim 7, wherein the node line is electrically connected to each of the first gate electrode and the third active pattern via one of a plurality of contact holes.

9. The OLED display of claim 8, wherein the node line and the data line are formed on the same layer.

10. The OLED display of claim 7, further comprising:
    a first scan line positioned over the second active pattern and electrically connected to the second and third gate electrodes; and
    a driving power supply line located adjacent to the data line over the first scan line, and electrically connected to the first active pattern.

11. The OLED display of claim 10, further comprising a capacitor electrode electrically connected to the driving power supply line, positioned over the first gate electrode, and overlapping the first gate electrode in the depth dimension of the OLED display to form a capacitor with the first gate electrode.

12. The OLED display of claim 10, wherein the TFTs further include a fourth TFT including i) a fourth active pattern electrically connected to the third active pattern and the first gate electrode via the node line and ii) a fourth gate electrode positioned over the fourth active pattern, and
wherein the OLED display further comprises:
a second scan line positioned over the fourth active pattern and electrically connected to the fourth gate electrode; and
an initialization power supply line electrically connected to the fourth active pattern.

13. The OLED display of claim 12, wherein the TFTs further include:
a fifth TFT including i) a fifth active pattern electrically connected to the first active pattern and the driving power supply line and ii) a fifth gate electrode positioned over the fifth active pattern; and
a sixth thin film transistor including i) a sixth active pattern electrically connected to the first active pattern and the OLED and ii) a sixth gate electrode positioned over the sixth active pattern, and
wherein the OLED display further comprises an emission control line positioned over each of the fifth and sixth active patterns and electrically connected to each of the fifth and sixth gate electrodes.

14. The OLED display of claim 13, wherein the TFTs further include a seventh thin film transistor including i) a seventh active pattern electrically connected to the fourth active pattern and ii) a seventh gate electrode positioned over the seventh active pattern, and wherein the OLED display further comprises a third scan line positioned over the seventh active pattern and electrically connected to the seventh gate electrode.

15. An organic light-emitting diode (OLED) display, comprising:
a substrate including a display area configured to display an image and a non-display area surrounding the display area, wherein the display area includes a first area and an second area, and wherein the second area is closer to the non-display area than the first area;
a plurality of OLEDs including a first OLED positioned in the first area and a second OLED positioned in the second area;
a plurality of pixel circuits positioned in the first and second areas and each pixel circuit including a node line formed over the substrate and overlapping the corresponding first or second OLED in the depth dimension of the OLED display so as to form a parasitic capacitor,
wherein the pixel circuits each include a plurality of thin film transistors (TFTs), wherein each of the OLEDs includes first and second electrode layers and a organic emission layer interposed therebetween, and wherein the first electrode layer overlaps at least some of the TFTs in the corresponding pixel circuit,
wherein the parasitic capacitor includes a first parasitic capacitor formed in the first area and a second parasitic capacitor formed in the second area, and
wherein the first parasitic capacitor is larger in size than the second parasitic capacitor.

16. The OLED display of claim 15, wherein the distance between the first electrode layer and the node line in the first parasitic capacitor is less than the distance between the first electrode layer and the node line in the second parasitic capacitor.

17. The OLED display of claim 16, wherein the first OLED includes a first dielectric layer having a first dielectric constant, wherein the second OLED includes a second dielectric layer having a second dielectric constant, and wherein the first dielectric constant is greater than the second dielectric constant.

18. The OLED display of claim 17, further comprising a data driver located farther from the first area than the second area and configured to provide data signals to the pixel circuits.

* * * * *